US 6,593,681 B2

(12) United States Patent
Ebisawa et al.

(10) Patent No.: US 6,593,681 B2
(45) Date of Patent: Jul. 15, 2003

(54) POLARIZATION APPARATUS AND POLARIZATION METHOD OF COAXIAL FLEXIBLE PIEZOELECTRIC CABLE

(75) Inventors: Mitsuo Ebisawa, Kyoto (JP); Takeshi Nagai, Nara (JP); Narutoshi Kanazawa, Sakai (JP); Masahiko Ito, Kashihara (JP); Yuko Fujii, Yamatokoriyama (JP); Tooru Sugimori, Yamatokoriyama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/020,474

(22) Filed: Dec. 12, 2001

(65) Prior Publication Data

US 2002/0140323 A1 Oct. 3, 2002

(30) Foreign Application Priority Data

| Dec. 15, 2000 | (JP) | .................. | 2000-381866 |
| Mar. 19, 2001 | (JP) | .................. | 2001-077883 |
| Mar. 19, 2001 | (JP) | .................. | 2001-077884 |
| Aug. 2, 2001  | (JP) | .................. | 2001-234555 |

(51) Int. Cl.$^7$ ........................ H01L 41/087; H01L 41/22; H01L 41/26
(52) U.S. Cl. ........................................ 310/357; 264/436
(58) Field of Search .............................. 310/357; 264/435, 264/436

(56) References Cited

U.S. PATENT DOCUMENTS

| 3,670,058 A | * | 6/1972 | Burney ........................ 264/436 |
| 4,427,609 A | * | 1/1984 | Broussoux et al. ......... 264/435 |
| 4,500,377 A | * | 2/1985 | Broussoux et al. ......... 156/164 |
| 4,800,048 A | * | 1/1989 | Bloomfield et al. ........ 264/435 |
| 4,985,195 A | * | 1/1991 | Wilson et al. .............. 264/320 |
| 5,311,884 A | * | 5/1994 | Scopelianos ................ 128/898 |
| 5,663,606 A | * | 9/1997 | Beurrier ..................... 310/357 |

FOREIGN PATENT DOCUMENTS

| EP | 1215737 A2 | * | 6/2002 | ......... H01L/41/087 |
| JP | 2002-252389 | * | 6/2002 | ......... H01L/41/22 |

* cited by examiner

Primary Examiner—Thomas M. Dougherty
(74) Attorney, Agent, or Firm—Pearne & Gordon LLP

(57) ABSTRACT

A polarization apparatus is provided wherein a piezoelectric body tube 3 is wound around a first rotation drum 5 and a second rotation drum 6 and a coaxial flexible piezoelectric body 2 is polarized while the piezoelectric body tube 3 is wound. According to the polarization apparatus, polarization can be conducted except for the coaxial flexible piezoelectric body 2 of the portion containing a defect and a defect existing in the piezoelectric body tube 3 of a given length can also be detected before an outer electrode 4 is formed.

33 Claims, 14 Drawing Sheets

US 6,593,681 B2

POLARIZATION APPARATUS AND POLARIZATION METHOD OF COAXIAL FLEXIBLE PIEZOELECTRIC CABLE

BACKGROUND OF THE INVENTION

1. Technical Field

This invention relates to polarization of a coaxial flexible piezoelectric cable.

2. Related Arts

Generally, as shown in FIG. 5, a coaxial flexible piezoelectric cable comprises a piezoelectric body tube 3 comprising a coaxial flexible piezoelectric body 2 formed surrounding a core electrode 1, an outer electrode 4 formed on the outer surface of the piezoelectric body tube 3, and a protective coat layer (not shown) formed surrounding the outer electrode 4.

Hitherto, the flexible piezoelectric body cable is polarized as follows:

Document 1 ("Atuden ceramic funmatu to gouseigomu tokaranaru atudenfukugouzairyou," Funntai to kougyou, 22kan, 1gou, 50–56 pp) shows that a high voltage is applied between the core electrode 1 and the outer electrode 4 for polarizing the coaxial flexible composite piezoelectric body 2. This is also disclosed in U.S. Pat. No. 4,568,851. Since the directions of spontaneous polarization of ceramic particles are made identical with the electric field direction by polarization, piezoelectricity is given to the coaxial flexible composite piezoelectric body 2. In this point, the polarization bears an important role.

Further, a coaxial flexible piezoelectric cable comprises a piezoelectric body tube 203 comprising a coaxial flexible piezoelectric body 202 formed surrounding a core electrode 201, an outer electrode 204 formed on the outer surface of the piezoelectric body tube 203, and a protective coat layer 205 formed surrounding the outer electrode 204, as shown in FIG. 9.

In the method, when a high voltage is applied between the core electrode 401 and the outer electrode 404, if the coaxial flexible piezoelectric body 402 contains a defect such as a minute crack or gap, discharge occurs in the defective part, and the core electrode 401 and the outer electrode 404 are electrically short-circuited. Consequently, it is made impossible to apply a high voltage between the core electrode 401 and the outer electrode 404 and thus it is made impossible to polarize the coaxial flexible piezoelectric body 402 (usually, having a length of several hundred meters or more). Since the presence of a defect cannot be detected until a high voltage is applied between the core electrode 401 and the outer electrode 404, in other words, until completion as a coaxial flexible piezoelectric body cable except for polarizing, manufacturing becomes unstable and yield is reduced.

Thus, the following polarization method of the flexible piezoelectric body cable is possible:

As shown in FIG. 17, a polarization apparatus is possible wherein a piezoelectric body tube 403 comprising a coaxial flexible piezoelectric body 402 formed surrounding a core electrode 401 is disposed on a block-like conductor 406 and DC voltage generation means 409 is connected to the block-like conductor 406 and the core electrode 401 through leads 408 and 481 for applying a DC voltage. According to the polarization apparatus, the coaxial flexible piezoelectric body 402 is disposed on the block-like conductor 406 and thus the block-like conductor 406 acts as an outer electrode 404. Therefore, a DC voltage can be applied between the block-like conductor 406 and the core electrode 401 by the DC voltage generation means 409 for polarizing the coaxial flexible piezoelectric body 402 of the portion disposed on the block-like conductor 406.

[Problems to be Solved]

However, when a high voltage is applied between the core electrode 1 and the outer electrode 4, if the coaxial flexible composite piezoelectric body 2 contains a defect such as a minute crack or gap, minute discharge occurs in the defective part. This minute discharge causes the conductive material forming the core electrode 1 and the outer electrode 4 and the material forming the coaxial flexible composite piezoelectric body 2 to be thermally evaporated and scattered, short-circuiting the core electrode 1 and the outer electrode 4. Consequently, it is made impossible to apply a high voltage between the core electrode 1 and the outer electrode 4 and thus it is made impossible to polarize the coaxial flexible composite piezoelectric body 2 (usually, having a length of several hundred meters or more); this is a problem.

Since the presence of a defect cannot be detected until a high voltage is applied between the core electrode 1 and the outer electrode 4, in other words, until completion as a coaxial flexible piezoelectric cable except for polarizing, manufacturing becomes unstable and yield is reduced; this is also a problem.

Further, the method in the related art involves the following problems: When a high voltage is applied between the core electrode 201 and the outer electrode 204, if the coaxial flexible piezoelectric body 202 contains a defect such as a minute crack or gap, minute discharge occurs in the defective part. This minute discharge causes the material forming the flexible piezoelectric body 202 to be thermally evaporated and scattered, short-circuiting the core electrode 201 and the outer electrode 204. Consequently, it is made impossible to apply a high voltage between the core electrode 201 and the outer electrode 204 and thus it is made impossible to polarize the coaxial flexible piezoelectric body 202 (usually, having a length of several hundred meters or more).

Since the presence of a defect cannot be detected until a high voltage is applied between the core electrode 201 and the outer electrode 204, in other words, until completion as a coaxial flexible piezoelectric cable except for polarizing, manufacturing becomes unstable and yield is reduced.

Still further, the method in the related art involves the following problems: When a high voltage is applied between the core electrode 301 and the outer electrode 304, if the coaxial flexible piezoelectric body 302 contains a defect such as a minute crack or gap, minute discharge occurs in the defective part. This minute discharge causes the material forming the flexible piezoelectric body 302 to be thermally evaporated and scattered, short-circuiting the core electrode 301 and the outer electrode 304. Consequently, it is made impossible to apply a high voltage between the core electrode 301 and the outer electrode 304 and thus it is made impossible to polarize the coaxial flexible piezoelectric body 302 (usually, having a length of several hundred meters or more).

Since the presence of a defect cannot be detected until a high voltage is applied between the core electrode 301 and the outer electrode 304, in other words, until completion as a coaxial flexible piezoelectric cable except for polarizing, manufacturing becomes unstable and yield is reduced.

Still further, the method in the related art involves the following problem:

If a DC voltage is applied to the block-like conductor 406 and the core electrode 401 by the DC voltage generation means 409, a force of causing the coaxial flexible piezoelectric body 402 and the block-like conductor 406 to attract each other is generated by an electrostatic force. Thus, to move the piezoelectric body tube 403, a frictional force occurs between the coaxial flexible piezoelectric body 402 and the block-like conductor 406, making it impossible to move the piezoelectric body tube 403. If the piezoelectric body tube 403 can be moved, a large force is required.

SUMMARY OF THE INVENTION

[Means for Solving the Problems]

To solve the above-described problems, according to the invention, there is provided a polarization apparatus of a coaxial flexible piezoelectric cable, comprising a first conductor drum having a plurality of grooves for coming in contact with a roughly half peripheral surface of a piezoelectric body tube comprising a coaxial flexible piezoelectric body formed surrounding a core electrode and being rotated in a given direction, a second conductor drum being placed behind the first conductor drum and having a plurality of grooves for coming in contact with another roughly half peripheral surface of the piezoelectric body tube, winding means being placed behind the second conductor drum for winding the piezoelectric body tube, conduction means for electrically connecting the first conductor drum and the second conductor drum, and voltage generation means being connected to the conduction means and the core electrode.

According to the invention, the coaxial flexible piezoelectric body is in contact with the grooves of the first conductor drum and the grooves of the second conductor drum, so that the first conductor drum and the second conductor drum act as outer electrodes. Therefore, a DC voltage is applied between the conduction means for electrically connecting the first conductor drum and the second conductor drum and the core electrode by the voltage generation means, whereby the coaxial flexible piezoelectric body of the portion disposed in the grooves of the first conductor drum and the grooves of the second conductor drum can be polarized.

To solve the above-described problems, according to the invention, there is provided a polarization apparatus of a coaxial flexible piezoelectric cable, comprising a block-like conductor having a passage of a piezoelectric body tube comprising a coaxial flexible piezoelectric body formed surrounding a core electrode, move means being placed behind the block-like conductor for moving the piezoelectric body tube, and DC voltage generation means being connected to the block-like conductor and the core electrode.

According to the invention, the coaxial flexible piezoelectric body is in contact with the block-like conductor, so that the block-like conductor acts as outer electrodes. Therefore, a DC voltage is applied between the block-like conductor and the core electrode by the DC voltage generation means, whereby the coaxial flexible piezoelectric body of the portion disposed on the block-like conductor can be polarized.

Still further, the invention is intended for solving the above-described problems in the related arts and it is an object of the invention to provide a polarization apparatus and a polarization method of a coaxial flexible piezoelectric body cable for making it possible to decrease the frictional force between a piezoelectric body tube and a block-like conductor and move the piezoelectric body tube by a small force.

To solve the above-described problems in the related arts, in a polarization apparatus of a coaxial flexible piezoelectric body cable of the invention, a block-like conductor has a piezoelectric body tube passage section formed with pits and projections to lessen frictional resistance. The frictional force between a piezoelectric body tube and the piezoelectric body tube passage section can be decreased in the presence of the pits and projections and the piezoelectric body tube can be moved by a small force.

[Mode for Carrying Out the Invention]

In the polarization apparatus as in aspect 1, the coaxial flexible piezoelectric body is disposed in the grooves of the first conductor drum and the grooves of the second conductor drum, so that the first conductor drum and the second conductor drum act as outer electrodes. Therefore, a DC voltage is applied between the conduction means for electrically connecting the first conductor drum and the second conductor drum and the core electrode by the voltage generation means, whereby only the coaxial flexible piezoelectric body of the portion disposed in the grooves of the first conductor drum and the grooves of the second conductor drum, which will be hereinafter referred to as coaxial flexible piezoelectric body polarized, can be polarized.

When the coaxial flexible piezoelectric body of the portion containing a minute defect becomes coaxial flexible piezoelectric body polarized, as the core electrode and the outer electrodes are short-circuited because of discharging in the defective part, it is made impossible to apply a high voltage between the conduction means and the core electrode. However, the coaxial flexible piezoelectric body polarized after the short-circuited part leaves the first conductor drum and the second conductor drum can be again normally polarized. Therefore, if a defective part exists, an accident in which it is made impossible to polarize the whole coaxial flexible piezoelectric body does not occur. This indicates that a minute defect exists in the portion of the coaxial flexible piezoelectric body polarized of a given length, so that a minute defect existing within the given length range can be detected before the outer electrode is formed.

In the polarization apparatus as in aspect 2, the first conductor drum and the second conductor drum are rotated by the piezoelectric body tube wound by the winding means. Therefore, the first conductor drum and the second conductor drum can be rotated in the opposite directions in synchronization without the need for any special unit for rotating the first conductor drum and the second conductor drum. Since the coaxial flexible piezoelectric body polarized is polarized only for the time during which it is disposed in the grooves of the first conductor drum and the grooves of the second conductor drum, so that the polarizing time can be controlled by controlling the winding speed of the winding means.

The polarization apparatus as in aspect 3 further comprises tension application means for applying a tension to the piezoelectric body tube before the piezoelectric body tube is disposed on the first conductor drum in addition to the components as in the preceding aspects. Since a given tension is applied to the coaxial flexible piezoelectric body before the coaxial flexible piezoelectric body is disposed as the coaxial flexible piezoelectric body polarized, the coaxial flexible piezoelectric body polarized can be disposed in intimate contact with the grooves of the first conductor drum and the grooves of the second conductor drum.

The polarization apparatus as in aspect 4 further comprises discharging means for removing the surface charges of the piezoelectric body tube after the piezoelectric body tube leaves the second conductor drum in addition to the components as in the preceding aspects. The surface charges occurring during polarizing exist on the surface of the coaxial flexible piezoelectric body polarized, but are removed by the discharging means. Thus, for example, if a part of a human body touches the surface of the coaxial flexible piezoelectric body, he or she does not receive an electric shock, so that safety of work can be ensured.

The polarization apparatus as in aspect 5 further comprises capacitance detection means for detecting the capacitance between the core electrode of the piezoelectric body tube and the conduction means in addition to the components as in the preceding aspects. If the intimate contact property between the coaxial flexible piezoelectric body polarized and the grooves of the first conductor drum and the grooves of the second conductor drum is poor, for example, if the coaxial flexible piezoelectric body polarized floats up from the grooves, the capacitance between the core electrode and the conduction means decreases, so that while a DC voltage is applied therebetween for polarizing, the intimate contact property therebetween can be monitored by the capacitance detection means at the same time.

The polarization apparatus as in aspect 6 further comprises an electrical insulating partition wall surrounding the first conductor drum and the second conductor drum in addition to the components as in the preceding aspects. When a high DC voltage is applied between the conduction means for electrically connecting the first conductor drum and the second conductor drum and the core electrode, the electrical insulating partition wall prevents a human body from touching the first conductor drum or the second conductor drum, so that safety of polarizing work can be ensured.

In the polarization apparatus as in aspect 7, the electrical insulating partition wall as in aspect 6 is transparent. While the coaxial flexible piezoelectric body is being wound by the winding means and when a DC voltage is applied between the core electrode of the coaxial flexible piezoelectric body and the conduction means, the rotation state of the first conductor drum and the second conductor drum and the motion of the coaxial flexible piezoelectric body polarized can be visually observed.

The polarization apparatus as in aspect 8 further comprises warm air generation means for blowing a warm current of air into the electrical insulating partition wall in addition to the components as in aspect 6. The warm air temperature is properly controlled, whereby the temperatures of the first conductor drum and the second conductor drum can be properly controlled, so that the coaxial flexible piezoelectric body polarized can be polarized at the necessary temperature.

In the polarization apparatus as in aspect 9, the first conductor drum and the second conductor drum as in the preceding aspects are formed of stainless steel. When discharge in a defective part existing in the coaxial flexible piezoelectric body polarized occurs, the thermal evaporation amount of the stainless steel is small, so that damage to the first conductor drum and the second conductor drum caused by the discharge can be lessened.

According to the invention as in aspect 10, there is provided a polarization method wherein a coaxial flexible piezoelectric body tube of a predetermined length is disposed in such a manner that steps of disposing the coaxial flexible piezoelectric body tube in one groove of a first conductor drum and then disposing the coaxial flexible piezoelectric body tube in a groove of a second conductor drum and disposing the coaxial flexible piezoelectric body tube in another groove of the first conductor drum are repeated and then when the coaxial flexible piezoelectric body tube is wound by winding means, a DC voltage is applied between core wire of the coaxial flexible piezoelectric body tube and conduction means.

When the coaxial flexible piezoelectric body polarized is disposed in one of the grooves of the first conductor drum, the half peripheral surface of the coaxial flexible piezoelectric body polarized comes in contact with the groove and on the other hand, when the coaxial flexible piezoelectric body polarized is disposed in one of the grooves of the second conductor drum, the other half peripheral surface of the coaxial flexible piezoelectric body polarized comes in contact with the groove. Consequently, the coaxial flexible piezoelectric body polarized can be polarized over the full peripheral surface thereof.

In the polarization method as in aspect 11, in the polarization method as in aspect 10, the core wire of the piezoelectric body tube is placed at ground potential and a DC voltage is applied between the core wire and the conduction means.

When a high DC voltage is applied between the conduction means for electrically connecting the first conductor drum and the second conductor drum and the core electrode, high DC voltage portions dangerous for the human bodies can be limited to the first conductor drum and the second conductor drum, so that a partition wall, etc., can easily ensure safety of the human bodies.

In the polarization method as in aspect 12, in the polarization method as in aspect 11, the coaxial flexible piezoelectric body tube comprises core wire and a coaxial composite piezoelectric body comprising chlorinated polyethylene and ceramic piezoelectric body powder. Since this composite piezoelectric body is rich in elasticity, it can easily come in intimate contact with the grooves of the first conductor drum and the grooves of the second conductor drum.

In the polarization apparatus as in aspect 13, the piezoelectric body tube is disposed in the passage of the block-like conductor, so that the block-like conductor acts as outer electrode. Therefore, a high voltage is applied between the block-like conductor and the core electrode, whereby only the coaxial flexible piezoelectric body of the portion disposed in the passage of the block-like conductor and in a groove of the block-like conductor, which will be hereinafter referred to as coaxial flexible piezoelectric body polarized, can be polarized.

When the coaxial flexible piezoelectric body of the portion containing a minute defect becomes coaxial flexible piezoelectric body polarized, as the core electrode and the outer electrode are short-circuited because of discharging in the defective part, it is made impossible to apply a high voltage between conduction means and the core electrode. However, the coaxial flexible piezoelectric body polarized after the short-circuited part leaves the block-like conductor can be again normally polarized. Therefore, if a defective part exists, an accident in which it is made impossible to polarize the whole coaxial flexible piezoelectric body does not occur. This indicates that a minute defect exists in the portion of the coaxial flexible piezoelectric body polarized of a given length, so that a minute defect existing within the given length range can be detected before the outer electrode is formed.

The polarization apparatus as in aspect 14 further comprises heating means having a heating block involving a heater for heating the block-like conductor for heating the piezoelectric body tube disposed on the block-like conductor in addition to the components as in aspect 13. Thus, the temperature of the piezoelectric body tube can be controlled, so that the coaxial flexible piezoelectric body can be polarized at the necessary temperature.

In the polarization apparatus as in aspect 15, the passage of the piezoelectric body tube as in aspect 13 is on a face of the block-like conductor. Since the block-like conductor need not be formed with the passage of the piezoelectric body tube, working on the block-like conductor is facilitated. Since the piezoelectric body tube need not be disposed in any groove or any hole of the block-like conductor, the piezoelectric body tube can be disposed more easily.

The polarization apparatus as in aspect 16 further comprises a resistor in series with the piezoelectric body tube in addition to the components as in any one of aspects 13 to 15. When the coaxial flexible piezoelectric body of the portion containing a minute defect becomes coaxial flexible piezoelectric body polarized, the voltage applied to the coaxial flexible piezoelectric body lowers and it is made impossible to polarize. However, since current can be controlled by the appropriate resistor, damage to the DC voltage generation means is prevented. The coaxial flexible piezoelectric body polarized after the defective part of the coaxial flexible piezoelectric body leaves the block-like conductor can be again normally polarized. Therefore, if a defective part exists, an accident in which it is made impossible to polarize the whole coaxial flexible piezoelectric body does not occur. This indicates that a minute defect exists in the portion of the coaxial flexible piezoelectric body polarized of a given length, so that a minute defect existing within the given length range can be detected before the outer electrode is formed.

According to the invention as in aspect 17, there is provided a polarization method comprising the steps of first disposing a piezoelectric body tube in a passage made in a block-like conductor and then when the piezoelectric body tube stops or is moved by move means, applying a DC voltage between core wire of the piezoelectric body tube and the block-like conductor. Therefore, the block-like conductor acts as an outer electrode, so that a high voltage is applied between the block-like conductor and the core electrode, whereby only the coaxial flexible piezoelectric body of the portion disposed in the groove of the block-like conductor and in the passage of the block-like conductor can be polarized.

The piezoelectric body tube stop and move time or the move speed of the piezoelectric body tube is controlled, whereby the coaxial flexible piezoelectric body can be polarized in the necessary time.

In the invention as in aspect 18, in the polarization method as in aspect 17, while the heating block involving a heater heats the block-like conductor for heating the piezoelectric body tube disposed on the block-like conductor, a DV voltage is applied between the core wire of the piezoelectric body tube and the block-like conductor. Since the temperature of the piezoelectric body tube can be controlled, the coaxial flexible piezoelectric body can be polarized at the necessary temperature.

In the polarization method as in aspect 19, in the polarization method as in aspect 17 or 18, the core wire of the piezoelectric body tube is placed at ground potential and a DC voltage is applied between the core wire and the block-like conductor. When a high DC voltage is applied between the block-like conductor and the core electrode, high DC voltage portions dangerous for the human bodies can be limited to the block-like conductor, so that a partition wall, etc., can easily ensure safety of the human bodies.

In the polarization apparatus as in aspect 20, a groove is provided as the passage of the piezoelectric body tube as in aspect 13. Since the passage placed in the block-like conductor is a groove, the top is opened and the piezoelectric body tube can be easily disposed from above the groove.

In the polarization apparatus as in aspect 21, a cover is placed on the groove of the piezoelectric body tube passage in addition to the components as in aspect 20. When the block-like conductor is heated for heating the piezoelectric body tube disposed in the block-like conductor, the cover blocks heat from escaping from the top of the groove. Thus, the temperature of the piezoelectric body tube can be controlled, so that the coaxial flexible piezoelectric body can be polarized at the necessary temperature.

In the polarization apparatus as in aspect 22, a hole is provided as the passage of the piezoelectric body tube as in aspect 13. When the block-like conductor is heated for heating the piezoelectric body tube disposed in the block-like conductor, the piezoelectric body tube placed in the hole is heated uniformly from the surroundings. Thus, the temperature of the piezoelectric body tube can be controlled, so that the coaxial flexible piezoelectric body can be polarized at the necessary temperature.

The polarization apparatus as in aspect 23 further comprises a resistor in series with the piezoelectric body tube in addition to the components as in any one of aspects 13, 14, and 20 to 22. When the coaxial flexible piezoelectric body of the portion containing a minute defect becomes coaxial flexible piezoelectric body polarized, the voltage applied to the coaxial flexible piezoelectric body lowers and it is made impossible to polarize. However, since current can be controlled by the appropriate resistor, damage to the DC voltage generation means is prevented. The coaxial flexible piezoelectric body polarized after the defective part of the coaxial flexible piezoelectric body leaves the block-like conductor can be again normally polarized. Therefore, if a defective part exists, an accident in which it is made impossible to polarize the whole coaxial flexible piezoelectric body does not occur. This indicates that a minute defect exists in the portion of the coaxial flexible piezoelectric body polarized of a given length, so that a minute defect existing within the given length range can be detected before the outer electrode is formed.

According to the invention as in aspect 24, there is provided a polarization method comprising the steps of first disposing a piezoelectric body tube in a passage made in a block-like conductor and then when the piezoelectric body tube stops or is moved by move means, applying a DC voltage between core wire of the piezoelectric body tube and the block-like conductor. Therefore, the block-like conductor acts as an outer electrode, so that a high voltage is applied between the block-like conductor and the core electrode, whereby only the coaxial flexible piezoelectric body of the portion disposed in the groove of the block-like conductor and in the passage of the block-like conductor can be polarized.

The piezoelectric body tube stop and move time or the move speed of the piezoelectric body tube is controlled, whereby the coaxial flexible piezoelectric body can be polarized in the necessary time.

In the invention as in aspect 25, in the polarization method as in aspect 24, while the heating block involving a heater heats the block-like conductor for heating the piezoelectric body tube disposed on the block-like conductor, a DV voltage is applied between the core wire of the piezoelectric body tube and the block-like conductor. Since the temperature of the piezoelectric body tube can be controlled, the coaxial flexible piezoelectric body can be polarized at the necessary temperature.

In the polarization method as in aspect 26, in the polarization method as in aspect 24 or 25, the core wire of the piezoelectric body tube is placed at ground potential and a DC voltage is applied between the core wire and the block-like conductor. When a high DC voltage is applied between the block-like conductor and the core electrode, high DC voltage portions dangerous for the human bodies can be limited to the block-like conductor, so that a partition wall, etc., can easily ensure safety of the human bodies.

According to the invention as in aspect 27, there is provided a polarization apparatus of a coaxial flexible piezoelectric body cable, comprising a block-like conductor having a passage section of a piezoelectric body tube comprising a coaxial flexible piezoelectric body formed surrounding a core electrode, the passage section being made uneven like pits and projections, and DC voltage generation means being connected to the block-like conductor and the core electrode. The piezoelectric body tube is disposed in the passage section of the block-like conductor so that the block-like conductor acts as outer electrodes. Therefore, a high voltage is applied between the block-like conductor and the core electrode, whereby the coaxial flexible piezoelectric body of the portion disposed in the block-like conductor can be polarized. The piezoelectric body tube passage section of the block-like conductor is made uneven like pits and projections. To move the piezoelectric body tube, the frictional force between the piezoelectric body tube and the piezoelectric body tube passage section can be decreased in the presence of the pits and projections and the piezoelectric body tube can be moved by a small force.

In the polarization apparatus as in aspect 28, the block-like conductor is provided with a heater in addition to the components as in aspect 27. The block-like conductor is heated by the heater for heating the piezoelectric body tube disposed in the block-like conductor and the temperature of the piezoelectric body tube can be controlled, so that the coaxial flexible piezoelectric body can be polarized at the necessary temperature.

The polarization apparatus as in aspect 29 is the polarization apparatus of a coaxial flexible piezoelectric body cable as in aspect 27 or 28 wherein wire netting is disposed on the block-like conductor to provide the passage section of the piezoelectric body tube. The metal netting is used to form pits and projections, so that the frictional force between the piezoelectric body tube and the piezoelectric body tube passage section can be decreased and the piezoelectric body tube can be moved by a small force without forming the disposition surface of the piezoelectric body tube like pits and projections.

The polarization apparatus as in aspect 30 is the polarization apparatus of a coaxial flexible piezoelectric body cable as in aspect 27 or 28 wherein the block-like conductor is formed with a groove formed with pits and projections and the piezoelectric body tube is disposed in the groove formed with pits and projections. If the block-like conductor is heated, the piezoelectric body tube disposed in the groove of the block-like conductor is heated from the bottom and both walls of the groove. Thus, the piezoelectric body tube is heated more evenly, so that the coaxial flexible piezoelectric body can be polarized at the necessary temperature. The top is opened and the piezoelectric body tube 403 can be easily disposed from above the groove.

The polarization apparatus as in aspect 31 is the polarization apparatus of a coaxial flexible piezoelectric body cable as in aspect 27 or 28 wherein the block-like conductor is formed with a groove on which wire netting is disposed and the piezoelectric body tube is disposed in the groove on which the wire netting is disposed. The piezoelectric body tube is disposed in the groove on which the wire netting is disposed, whereby the piezoelectric body tube and the wire netting come in point contact with each other. Thus, the frictional force between the piezoelectric body tube and the piezoelectric body tube disposition face can be decreased and the piezoelectric body tube can be moved by a small force.

According to the invention as in aspect 32, there is provided a polarization method comprising the steps of disposing a piezoelectric body tube in a passage section of a block-like conductor and applying a DC voltage between core wire of the piezoelectric body tube and the block-like conductor. Therefore, the block-like conductor acts as an outer electrode, so that a high voltage is applied between the block-like conductor and the core electrode, whereby the coaxial flexible piezoelectric body of the portion disposed in the block-like conductor and in the passage section of the block-like conductor can be polarized. The piezoelectric body tube passage section of the block-like conductor is made uneven like pits and projections to lessen frictional resistance. The piezoelectric body tube and the piezoelectric body tube passage section come in point contact with each other in the presence of the pits and projections. Thus, the frictional force between the piezoelectric body tube and the piezoelectric body tube disposition face can be decreased and the piezoelectric body tube can be moved by a small force. The piezoelectric body tube stop and move time or the move speed of the piezoelectric body tube is controlled, whereby the coaxial flexible piezoelectric body can be polarized in the necessary time.

In the invention as in aspect 33, in the polarization method as in aspect 32, while the heating block involving a heater heats the block-like conductor for heating the piezoelectric body tube disposed on the block-like conductor, a DV voltage is applied between the core wire of the piezoelectric body tube and the block-like conductor. Since the temperature of the piezoelectric body tube can be controlled, the coaxial flexible piezoelectric body can be polarized at the necessary temperature.

DETAILED DESCRIPTION OF THE PREFERRED EMBODIMENTS

[Embodiments]

Referring now to the accompanying drawings, there are shown preferred embodiments of the invention.

(Embodiment 1)

Figure 1:
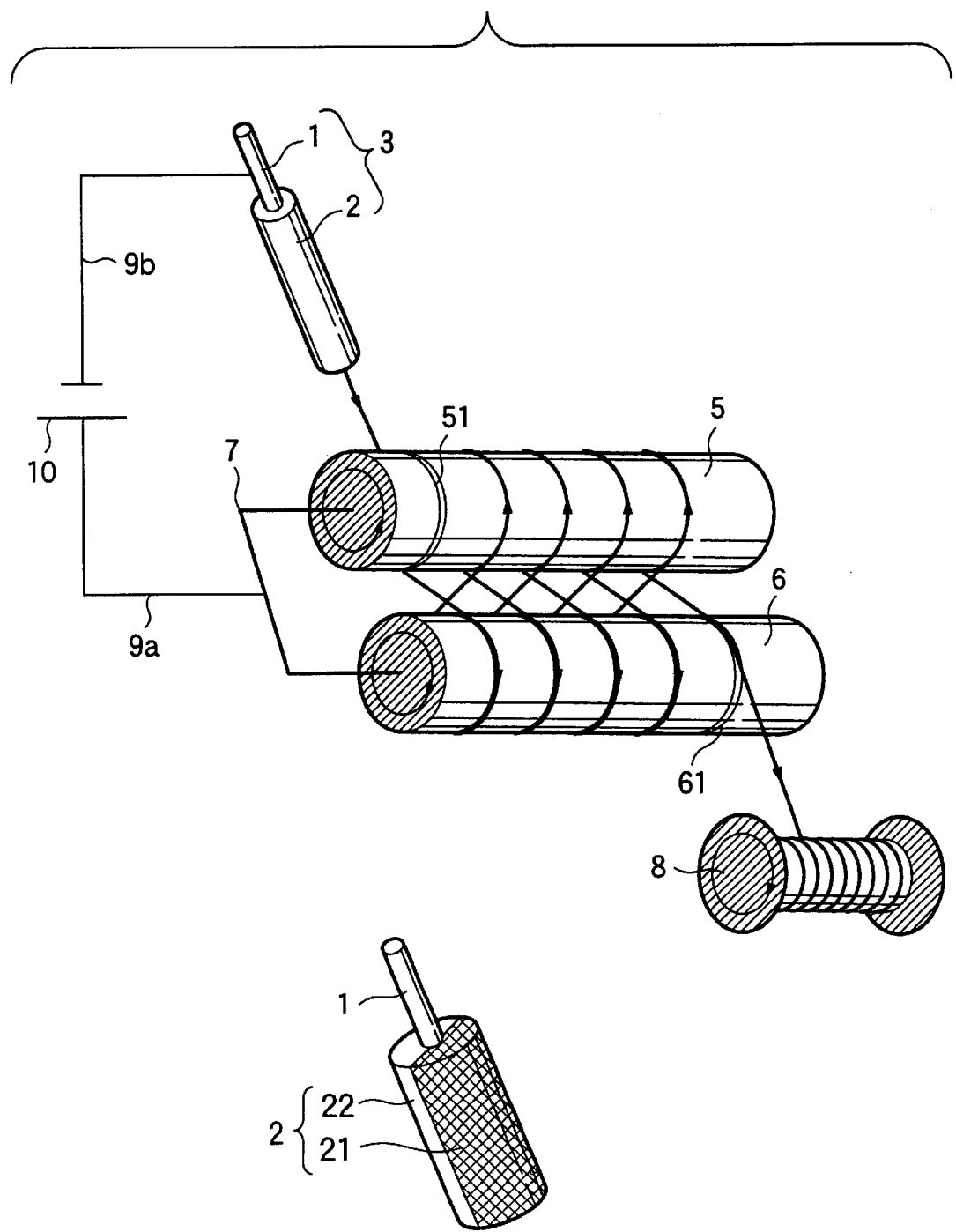
FIG. 1 is an appearance sketch drawing to show the configuration of a polarization apparatus of a coaxial flexible piezoelectric cable in an embodiment 1 of the invention.

FIG. 1 is an appearance sketch drawing to show the configuration of a coaxial flexible piezoelectric body polarization apparatus of an embodiment 1 of the invention. A flexible piezoelectric body 2 is formed coaxially on a core electrode 1 (hereinafter, this molded body will be referred to as piezoelectric body tube 3). Coil-like metal wire, a bundle of fine lines, or the like is used as the core electrode 1. Used as the flexible piezoelectric body 2 is a composite piezoelectric body comprising ceramic piezoelectric body powder of zirconate-lead titanate, etc., added to a polymeric base material of an epoxy resin, a urethane resin, a chloroprene resin, a chlorinated polyethylene resin, etc., a polymeric piezoelectric body of PVDF, etc., or the like.

Figure 2:
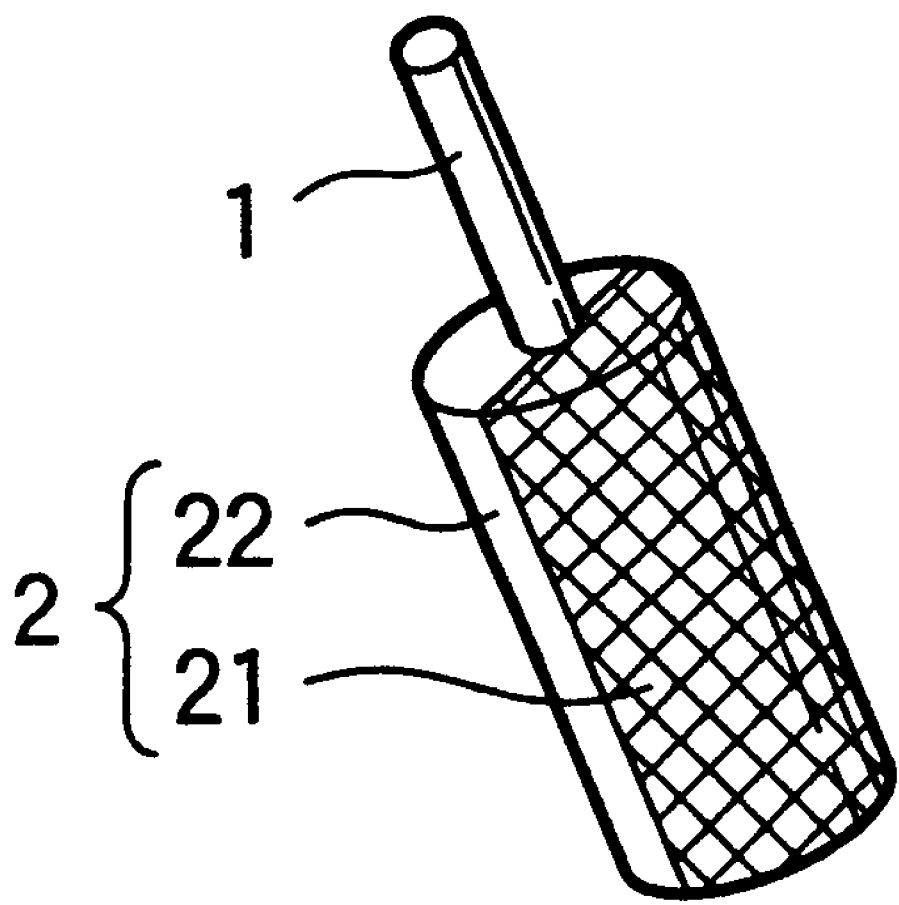
FIG. 2 is an enlarged appearance sketch drawing to show a piezoelectric body tube in the embodiment 1 of the invention.

The piezoelectric body tube 3 is wound around a groove at an end part of a first conductor drum 5 shaped like a column, for example, having a plurality of grooves 51, which will be hereinafter referred to as first rotation drum 5, and next is wound around a groove at an end part of a second conductor drum 6 shaped like a column, for example, having a plurality of grooves 61, which will be hereinafter referred to as second rotation drum 6, and further is wound around the groove adjacent to the groove at the end part of the first rotation drum 5. As these steps are repeated the piezoelectric body tube 3 is wound to a predetermined length and then is wound on a winding drum 8. In FIG. 1, the piezoelectric body tube 3 wound around the first rotation drum 5, the second rotation drum 6, the winding drum 8, etc., is indicated by the black solid line and the winding direction is indicated by the arrow. FIG. 2 is an enlarged appearance sketch drawing to show the piezoelectric body tube 3. A half peripheral surface 21 of the coaxial flexible piezoelectric body 2 comes in contact with the grooves of the first rotation drum 5 and remaining half peripheral surface 22 of the coaxial flexible piezoelectric body 2 comes in contact with the grooves of the second rotation drum 6, so that the piezoelectric body tube 3 is wound. The first rotation drum 5 and the second rotation drum 6 are connected electrically by conduction means 7. The conduction means 7 is connected electrically to the positive pole or the negative pole of DC voltage generation means 10 via a lead 9a and the core electrode 1 is connected electrically to the opposite pole of the DC voltage generation means 10 via a lead 9b.

When the parts are connected in such a manner and the winding drum 8 is rotated for winding the piezoelectric body tube 3, a high voltage is applied between the core electrode 1 and the first rotation drum 5 by the DC voltage generation means 10, so that the coaxial flexible piezoelectric body 2 of the half peripheral surface 21 part is polarized. Likewise, a high voltage is also applied between the core electrode 1 and the second rotation drum 6, so that the coaxial flexible piezoelectric body 2 of the half peripheral surface 22 part is polarized. Therefore, the coaxial flexible piezoelectric body 2 is polarized over the full peripheral surface thereof for the time during which the half peripheral surfaces 21 and 22 are wound around the first rotation drum 5 or the second rotation drum 6. At the polarizing time, a high voltage of (5 to 10) kV/mm is applied between the core electrode 1 and the first rotation drum 5 and the second rotation drum 6.

When the coaxial flexible piezoelectric body 2 contains a minute defect and the portion containing the defect is wound around the first rotation drum 5 or the second rotation drum 6, minute discharge occurring in the defective part causes the core electrode 1 and the first rotation drum 5 or the second rotation drum 6 to be thermally evaporated, leading to short-circuiting the first rotation drum 5 or the second rotation drum 6 and the core electrode 1. Consequently, it is made impossible to polarize. However, if the defective part leaves the second rotation drum 6 and the coaxial flexible piezoelectric body 2 wound around the first rotation drum 5 and the second rotation drum 6 does not contain any defect at the time, the insulation property between the first rotation drum 5 or the second rotation drum 6 and the core electrode 1 is restored, so that polarization is made possible.

Thus, according to the polarization apparatus of the embodiment, polarization cannot be conducted only when the portion containing the defect is wound around the first rotation drum 5 and the second rotation drum 6; otherwise, polarization is possible. Therefore, an accident in which it is made impossible to polarize the piezoelectric body tube 3 over the whole in the presence of the defective part does not occur. It is clear that a defect exists in the coaxial flexible piezoelectric body 2 polarized at the point in time when the discharge occurred. Therefore, a defect existing in the piezoelectric body tube 3 of a given length can be detected before an outer electrode 4 is formed, so that the defective part can be easily removed after completion as a piezoelectric cable. Accordingly, manufacturing can be made stable and yield can also be enhanced.

When the half peripheral surface 21 of the coaxial flexible piezoelectric body 2 comes in contact with the grooves of the first rotation drum 5 and the remaining half peripheral surface 22 of the coaxial flexible piezoelectric body 2 comes in contact with the grooves of the second rotation drum 6 for winding the piezoelectric body tube 3, the first rotation drum 5 and the second rotation drum 6 need to be rotated in opposite directions at the same rotation speed. For this purpose, the first rotation drum 5 and the second rotation drum 6 may be driven by separate motors; however, it is desirable that the first rotation drum 5 and the second rotation drum 6 should be driven by a tension occurring in the piezoelectric body tube 3 when the tube 3 is wound on the winding drum 8. Accordingly, both the drums 5 and 6 can be easily rotated in the opposite directions at the same rotation speed.

(Embodiment 2)

Figure 3:
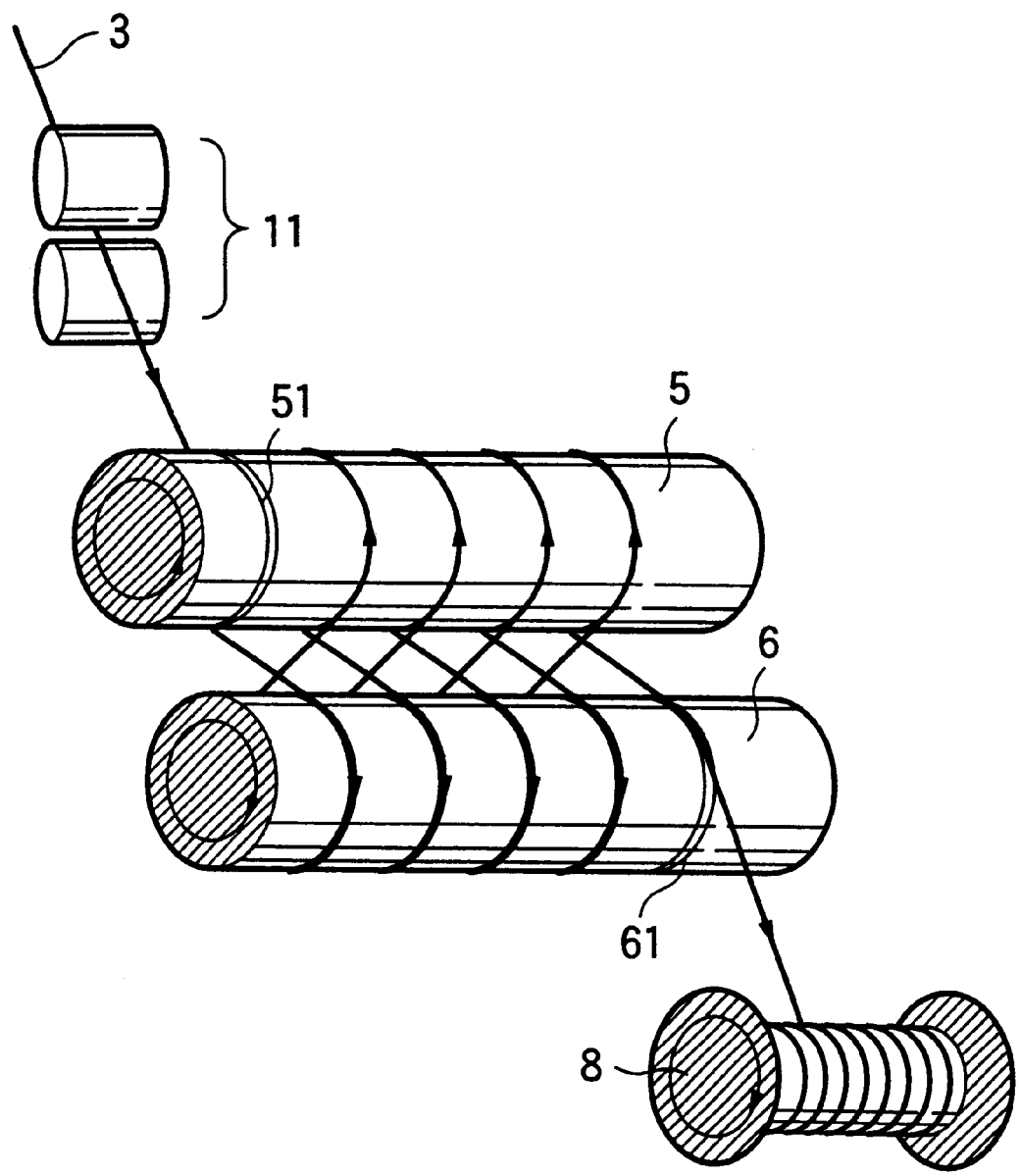
FIG. 3 is an appearance sketch drawing to show the configuration of a polarization apparatus of a coaxial flexible piezoelectric cable in an embodiment 2 of the invention.

FIG. 3 is an appearance sketch drawing to show the configuration of a coaxial flexible piezoelectric body polarization apparatus of an embodiment 2 of the invention.

When a piezoelectric body tube 3 is wound by a winding drum 8, it is desirable that a tension should be applied to the piezoelectric body tube 3 by tension application means 11 before the piezoelectric body tube 3 is wound around a first rotation drum 5, because when a half peripheral surface 21 of a coaxial flexible piezoelectric body 2 comes in contact with a groove of the first rotation drum 5, the intimate contact property therebetween becomes good. When the intimate contact property is poor, for example, when an air layer exists therebetween, if a high voltage is applied between the first rotation drum 5 and a core electrode 1, the effective voltage actually applied to the coaxial flexible piezoelectric body 2 lessens and thus it is made impossible to conduct sufficient polarization. This also applies to the case of the other half peripheral surface 22 of the coaxial flexible piezoelectric body 2.

Available as the tension application means 11 is a configuration wherein two rotation bodies are placed so as to sandwich the piezoelectric body tube 3 therebetween and the distance between the two rotation bodies is selected appropriately, thereby controlling the physical resistance applied when the piezoelectric body tube 3 passes through the space between the two rotation bodies.

(Embodiment 3)

Figure 4:
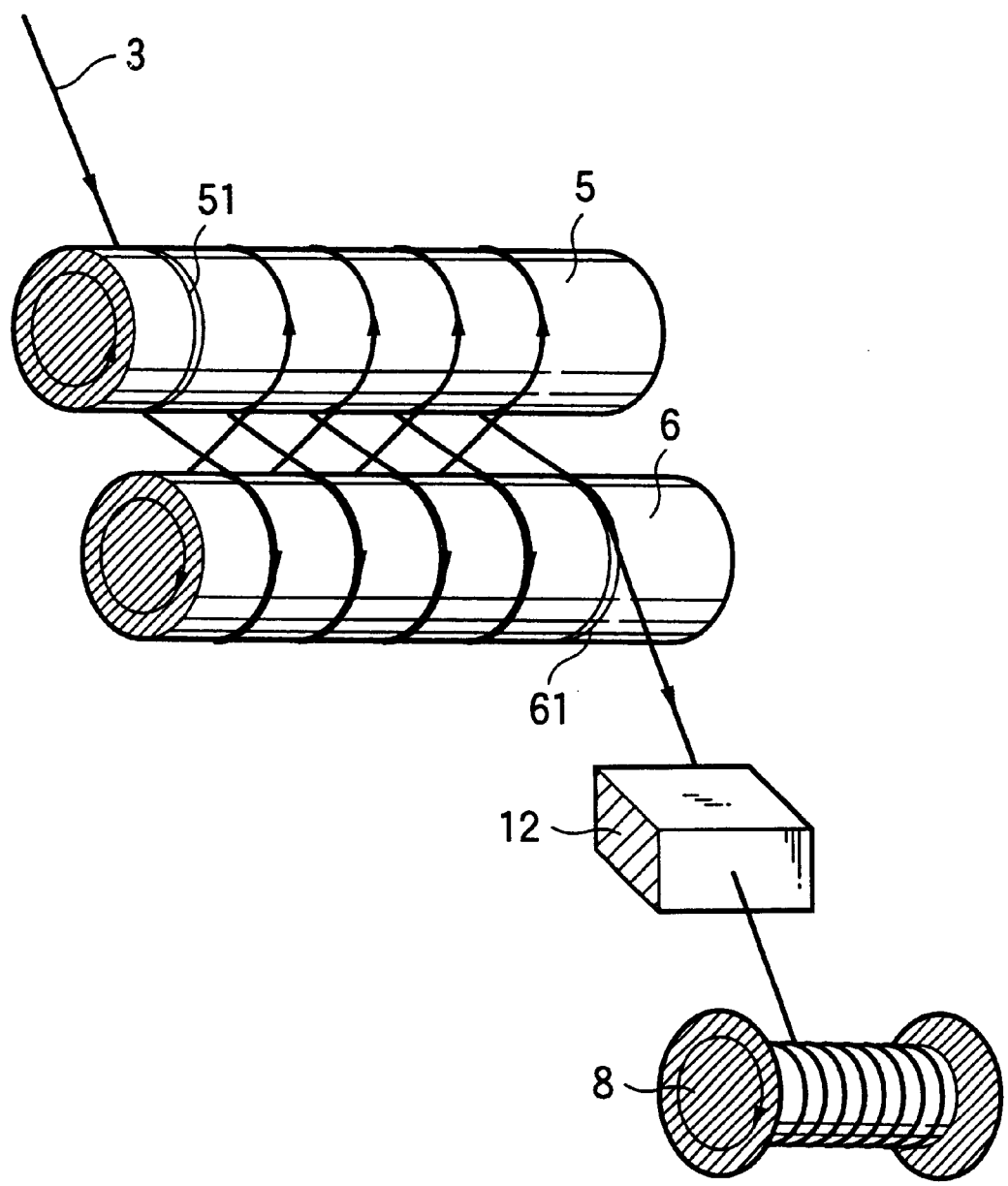
FIG. 4 is an appearance sketch drawing to show the configuration of a polarization apparatus of a coaxial flexible piezoelectric cable in an embodiment 3 of the invention.
Figure 5:
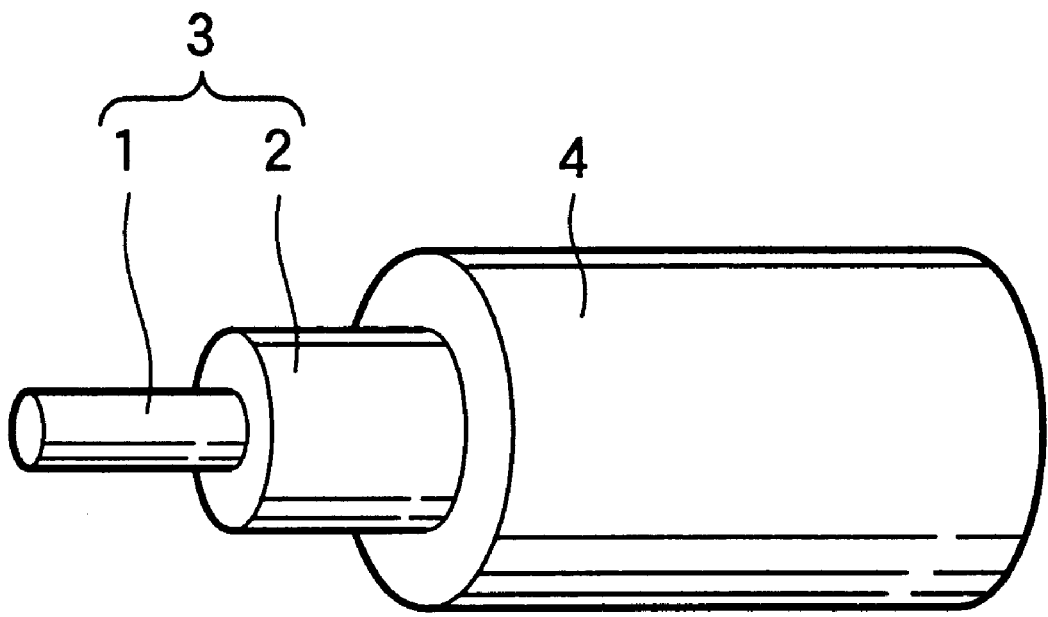
FIG. 5 is an appearance perspective view to show the configuration of a coaxial flexible piezoelectric element in a related art.

FIG. 4 is an appearance sketch drawing to show the configuration of a coaxial flexible piezoelectric body polarization apparatus of an embodiment 3 of the invention.

After a coaxial flexible piezoelectric body 2 is polarized, charges remain on a core electrode 1 and the outer peripheral surface of the coaxial flexible piezoelectric body 2 (a half peripheral surface 21 and the other half peripheral surface 22). When a human body touches the remaining charges, the remaining charges are discharged through the human body and there may be a danger. To ensure safety of polarization work, it is desirable that discharging means 12 for removing the remaining charges after a piezoelectric body tube 3 leaves a second rotation drum 6 should be provided.

The remaining charges can be removed by placing the core electrode 1 and the outer peripheral surface of the coaxial flexible piezoelectric body 2 substantially in the same potential. Therefore, the discharging means 21 may have, for example, such a configuration wherein the piezoelectric body tube 3 passes through a conductive liquid, such as tap water, connected to the core electrode 1. As the same configuration as that wherein the piezoelectric body tube 3 is wound around a first rotation drum 5 and the second rotation drum 6, the piezoelectric body tube 3 may be wound around a conductive rotation drum for discharging and this conductive rotation drum for discharging may be connected to the core electrode 1.

To ensure safety of polarization work also containing discharging of the remaining charges, it is desirable that the first rotation drum 5 and the second rotation drum 6 should be connected to the positive polarity or the negative polarity of high DC voltage and that the core electrode 1 should be grounded. High-voltage parts are limited to the first rotation drum 5, the second rotation drum 6, conduction means 7, a lead 9a, and the like and thus only these parts are isolated from the outside, whereby the possibility that a human body will touch any of the high-voltage parts can be decreased easily. When the remaining charges are discharged, the conductive rotation drum for discharging may be held at ground potential and thus no danger is involved. On the other hand, if the core electrode 1 is connected to the positive electrode or the negative electrode of DC voltage generation means 10, the core electrode 1 is held at a high voltage and thus high voltage parts exist in the whole polarization apparatus. Therefore, the possibility that a human body will touch any of the high-voltage parts is increased.

To isolate from the outside the first rotation drum 5 and the second rotation drum 6 to which a high voltage is applied, it is desirable that an electrical insulating partition wall should be provided surrounding the first rotation drum 5 and the second rotation drum 6. Accordingly, a human being can be easily prevented from touching the portions. It is also desirable that the partition wall should be transparent. Since the motion state of the piezoelectric body tube 3 can be visually observed containing the tops of the first rotation drum 5 and the second rotation drum 6, whether or not the piezoelectric body tube 3 is properly placed in grooves of the first rotation drum 5 and grooves of the second rotation drum 6 can always be checked.

The temperature when the coaxial flexible piezoelectric body 2 is polarized generally is higher than that when the coaxial flexible piezoelectric body 2 is used. In this point, to properly hold the temperature at the polarizing time, it is desirable that a warm current of air controlled to a proper temperature should be blown into the partition wall. The warm air itself is an excellent insulator and can hold the first rotation drum 5 and the second rotation drum 6 at proper temperature without impairing the electrical insulation properties of the first rotation drum 5 and the second rotation drum 6, so that the coaxial flexible piezoelectric body 2 can be polarized at any desired temperature.

It is desirable that the capacitance between the core electrode 1 and the first rotation drum 5 and the second rotation drum 6 should also be monitored at the same time as a high voltage is applied between the core electrode 1 and the first rotation drum 5 and the second rotation drum 6 for polarizing the coaxial flexible piezoelectric body 2. While the coaxial flexible piezoelectric body 2 is polarized, a high voltage which becomes a constant electric field strength (voltage per unit thickness) is applied in response to the thickness of the coaxial flexible piezoelectric body 2. Therefore, preferably the thickness of the coaxial flexible piezoelectric body 2 is monitored. Since the capacitance depends on the thickness of the coaxial flexible piezoelectric body 2 and the degree of eccentricity relative to the core electrode 1, the capacitance can be monitored for detecting a local fluctuation of the thickness.

Since the first rotation drum 5 and the second rotation drum 6 are electrically conductive, the coaxial flexible piezoelectric body 2 can be polarized. However, when minute discharge occurs in a defective part, not only the core electrode 1, but also the first rotation drum 5 and the second rotation drum 6 are thermally evaporated. A material having a low melting point, such as aluminum, is easily thermally evaporated. On the other hand, stainless steel has a high melting point and is hard to thermally evaporate and also has a physically excellent strength and thus is hard to damage, etc., during operating. Considering these points, preferably the first rotation drum 5 and the second rotation drum 6 are formed of stainless steel.

Although various materials can be used as the flexible piezoelectric body 2 as described above, a composite piezoelectric body comprising ceramic piezoelectric body powder of zirconate-lead titanate, etc., added to a rubber-based resin is excellent. A chlorinated polyethylene resin or a chloroprene resin is used as the rubber-based resin. Since this kind of composite piezoelectric body is rich in elasticity, the flexible piezoelectric body 2 easily comes in intimate contact with the grooves of the first rotation drum 5 and the grooves of the second rotation drum 6.

(Embodiment 4)

Figure 6:
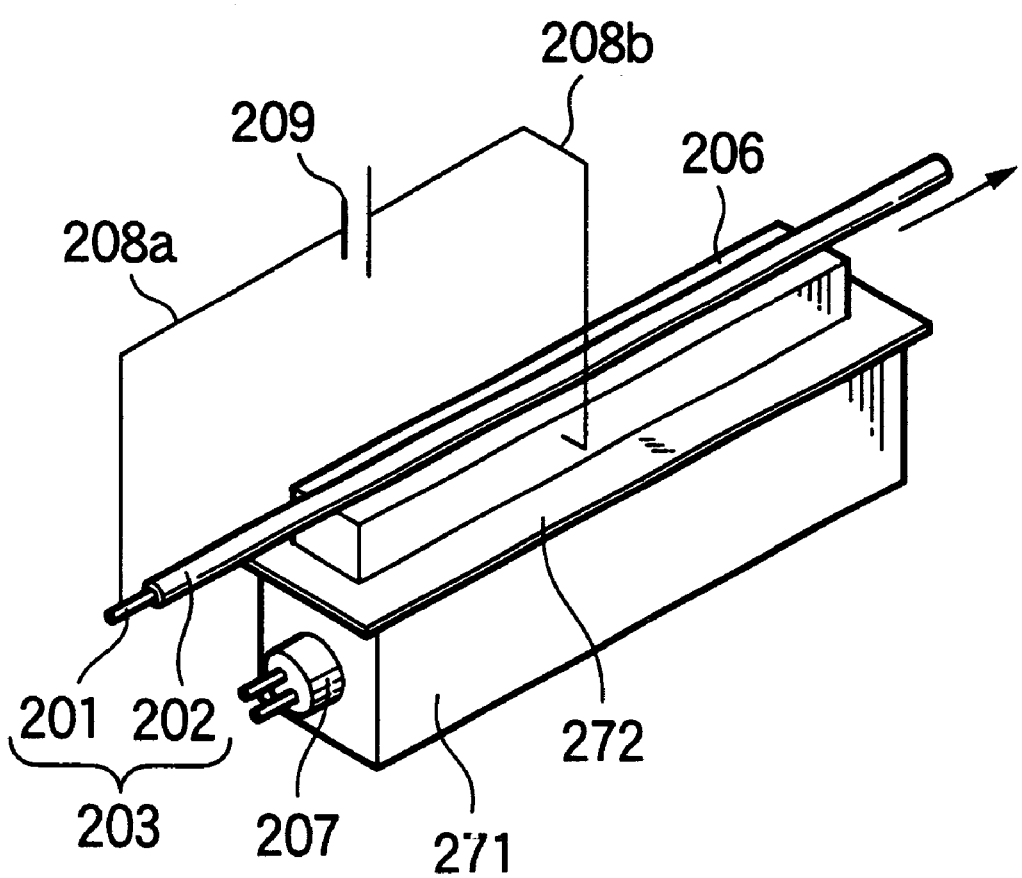
FIG. 6 is an appearance sketch drawing to show the configuration of a polarization apparatus in an embodiment 4 of the invention.

FIG. 6 is an appearance sketch drawing to show the configuration of a coaxial flexible piezoelectric body polarization apparatus in an embodiment 4 of the invention. A coaxial flexible piezoelectric body 202 is formed on a core electrode 201 (hereinafter, this molded body will be referred to as piezoelectric body tube 203). Coil-like metal wire, a bundle of fine lines, or the like is used as the core electrode 201. Used as the flexible piezoelectric body 202 is a composite piezoelectric body comprising ceramic piezoelectric body powder of zirconate-lead titanate, etc., added to a polymeric base material of an epoxy resin, a urethane resin, a chloroprene resin, a chlorinated polyethylene resin, etc., a polymeric piezoelectric body of PVDF, etc., or the like.

The piezoelectric body tube 203 is disposed on a face of a block-like conductor 206 and then is moved by move means (not shown). As the block-like conductor 206, a conductor of iron, stainless steel, copper, brass, aluminum, etc., is used. To work on the block-like conductor 206, cutting, grinding, extrusion, press working, etc., is executed. In the embodiment, aluminum easily available and easily to work on is used as the material of the block-like conductor 206. Specifically, it is 30 mm wide, 20 mm high, and 500 mm long relative to the piezoelectric body tube 203 having an outer diameter of 2 mm. As the move means (not shown), the piezoelectric body tube 203 is wound around a winding drum and this winding drum is rotated for moving the piezoelectric body tube 203. In FIG. 1, the move direction of the piezoelectric body tube 203 disposed on the block-like conductor 206 is indicated by the arrow.

The temperature when the coaxial flexible piezoelectric body 202 is polarized generally is higher than that when the coaxial flexible piezoelectric body 202 is used. Thus, to properly hold the temperature of the coaxial flexible piezoelectric body 202 at the polarizing time, heating means is provided. As the heating means, a heating block 271 involving a heater 207 is used to heat the block-like conductor 206 at any desired temperature through an insulation sheet 272. In the embodiment, as the insulation sheet 272, mica 0.5 mm thick is used, but polyimide, poly-tetra-fluoro-ethylene, polyethylene terephthalate (PET), silicone rubber, etc., may be used. The piezoelectric body tube 203 is disposed on the face of the block-like conductor 206, whereby it is indirectly heated from the bottom of the piezoelectric body tube 203. Since the piezoelectric body tube 203 can be kept at any desired temperature by controlling output of the heater 207, the coaxial flexible piezoelectric body 202 can be polarized at the necessary temperature.

The block-like conductor 206 is electrically connected by a lead 208b. A lead 208a is connected electrically to the positive pole or the negative pole of DC voltage generation means 209 and the core electrode 201 is connected electrically to the opposite pole of the DC voltage generation means 209 via the lead 208a.

While the piezoelectric body tube 203 is made still or is moved with the parts thus connected, a high voltage is applied between the core electrode 201 and the block-like conductor 206 by the DC voltage generation means 209, so that the coaxial flexible piezoelectric body 202 is polarized.

At the polarizing time, a high voltage of 5 to 10 kV/mm is applied between the core electrode 201 and the block-like conductor 206. Specifically, polarization is conducted with the piezoelectric body tube 203 at temperature of 120° C. and with a voltage of 8 kV/mm applied.

When the coaxial flexible piezoelectric body 202 contains a minute defect and the portion containing the defect is disposed on the block-like conductor 206, minute discharge occurring in the defective part causes the block-like conductor 206 and the core electrode 201 to be short-circuited. Consequently, it is made impossible to polarize. However, if the defective part leaves the block-like conductor 206 and the coaxial flexible piezoelectric body 202 disposed on the block-like conductor 206 does not contain any defect at the time, the insulation property between the block-like conductor 206 and the core electrode 201 is restored, so that polarization is made possible. Thus, according to the polarization apparatus of the embodiment, polarization cannot be conducted only when the portion containing the defect is disposed on the face of the block-like conductor 206; otherwise, polarization is possible. Therefore, an accident in which it is made impossible to polarize the piezoelectric body tube 203 over the whole in the presence of the defective part does not occur. It is clear that a defect exists in the coaxial flexible piezoelectric body 202 at the point in time when the discharge occurred. Therefore, a defect existing in the piezoelectric body tube 203 of a given length can be detected before an outer electrode 204 is formed, so that the defective part can be easily removed after completion as a piezoelectric cable. Accordingly, manufacturing can be made stable and yield can also be enhanced.

(Embodiment 5)

Figure 7:
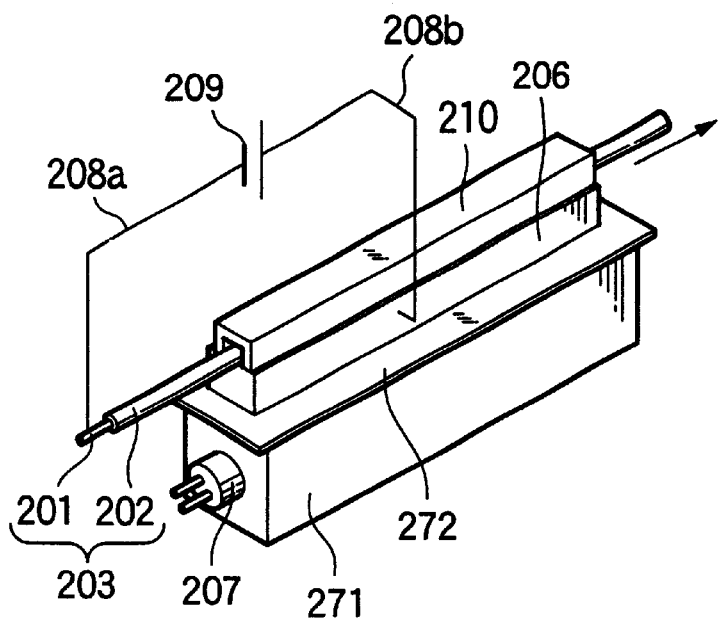
FIG. 7 is an appearance sketch drawing to show the configuration of a polarization apparatus in an embodiment 5 of the invention.

FIG. 7 is an appearance sketch drawing to show the configuration of a coaxial flexible piezoelectric body polarization apparatus in an embodiment 5 of the invention. The embodiment 5 differs from the embodiment 4 in that a cover 210 is provided. The cover 210 is provided with a space for allowing a piezoelectric body tube 203 to move and is angular U-shaped in cross section. The piezoelectric body tube 203 is disposed on the top face of the block-like conductor 206, whereby it is indirectly heated from the bottom of the piezoelectric body tube 203. Further, the piezoelectric body tube 203 is covered with the cover 210 and thus can be kept at more even temperature and the coaxial flexible piezoelectric body 202 can be polarized at the necessary temperature. As the cover 210, a general heat insulation material (glass wool, ceramic fiber, etc.,), heat-resistant resin, metal (iron, stainless steel, copper, brass, aluminum, etc.,), or the like is used. In the embodiment, an extruded material of aluminum is used.

(Embodiment 6)

Figure 8:
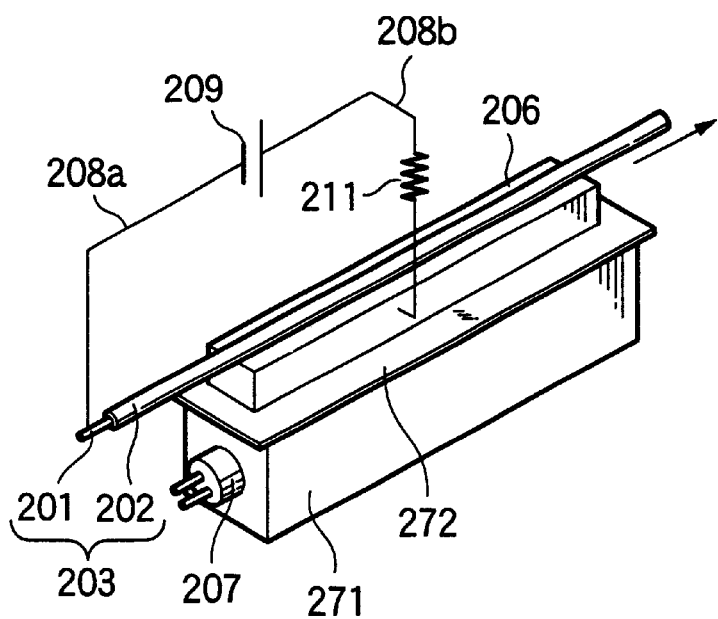
FIG. 8 is an appearance sketch drawing to show the configuration of a polarization apparatus in an embodiment 6 of the invention.
Figure 9:
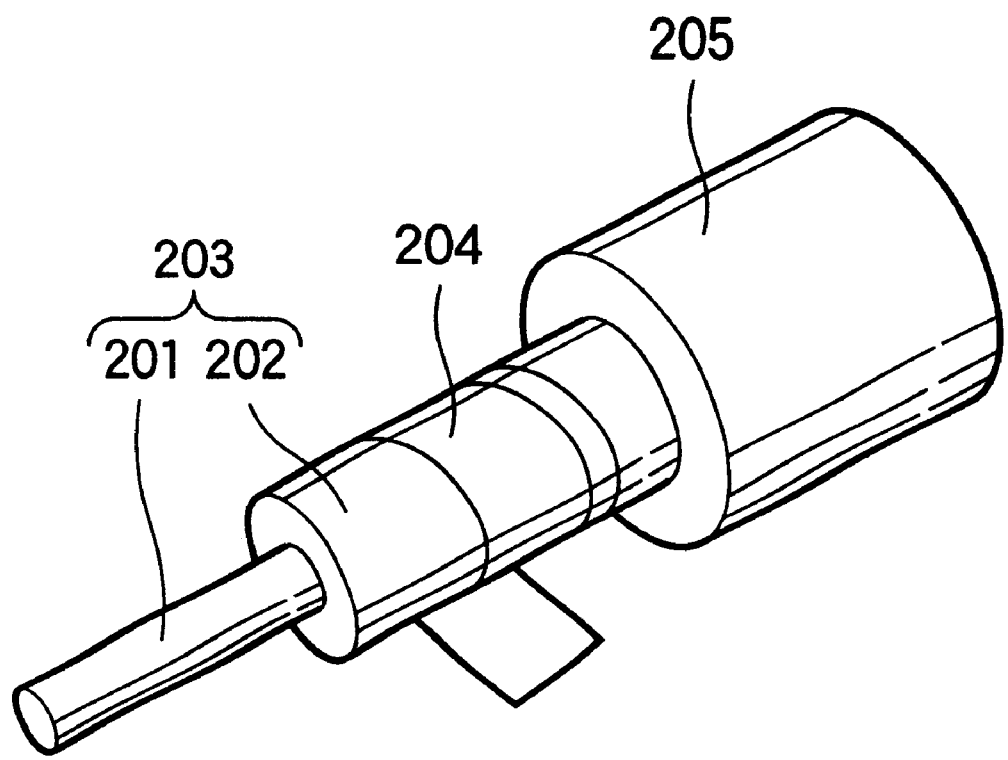
FIG. 9 is an appearance perspective view to show the configuration of a coaxial flexible piezoelectric element in a related art.

FIG. 8 is an appearance sketch drawing to show the configuration of a coaxial flexible piezoelectric body polarization apparatus in an embodiment 6 of the invention. The coaxial flexible piezoelectric body polarization apparatus in the embodiment 6 comprises a resistor 211 in series with a piezoelectric body tube 203 in addition to the configuration of the coaxial flexible piezoelectric body polarization apparatus in the embodiment 4 or 5. When a coaxial flexible piezoelectric body 202 of the portion containing a minute defect becomes a coaxial flexible piezoelectric body polarized 202, the voltage applied to the coaxial flexible piezoelectric body 202 lowers and it is made impossible to polarize. However, since current can be controlled by the resistor 211, damage to DC voltage generation means is prevented and the coaxial flexible piezoelectric body polarized 202 after the defective part of the coaxial flexible piezoelectric body 202 leaves a block-like conductor 206 can be again normally polarized. Therefore, if a defective part exists, an accident in which it is made impossible to polarize the whole coaxial flexible piezoelectric body 202 does not occur. This indicates that a minute defect exists in the portion of the coaxial flexible piezoelectric body polarized 202 of a given length, so that a minute defect existing within the given length range can be detected before an outer electrode 204 is formed.

(Embodiment 7)

Figure 10:
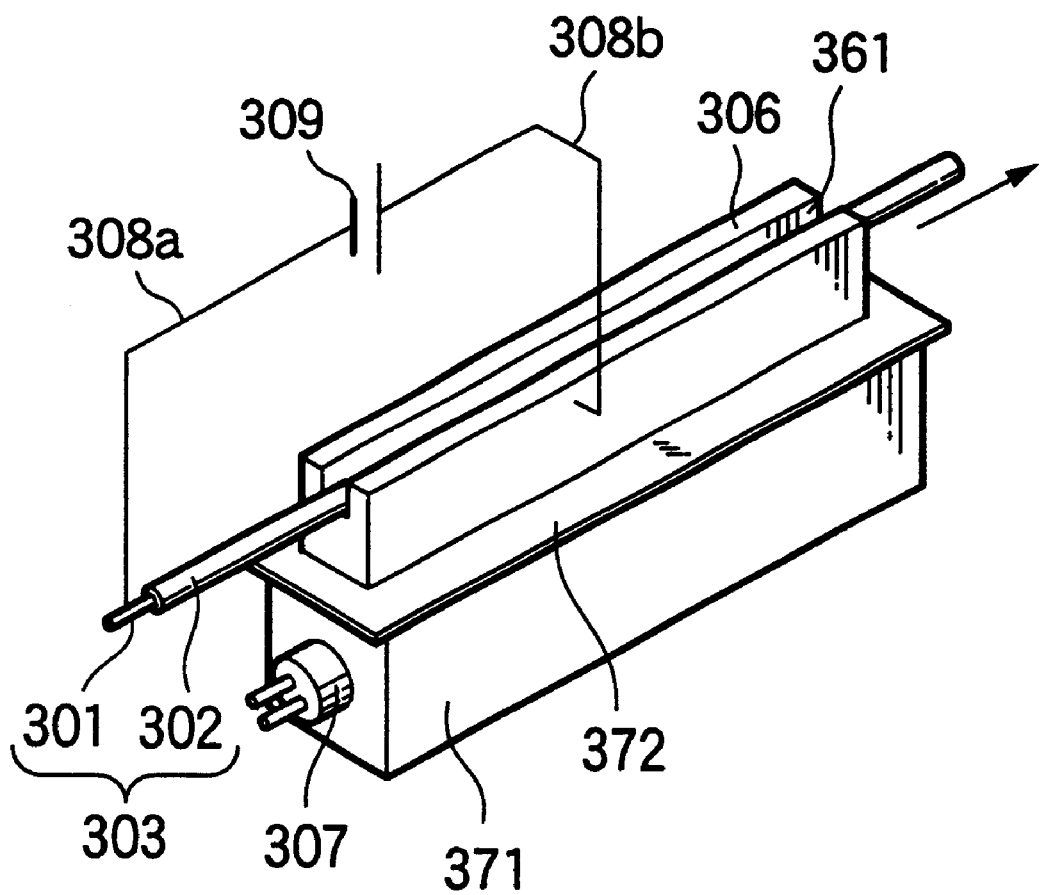
FIG. 10 is an appearance sketch drawing to show the configuration of a polarization apparatus in an embodiment 7 of the invention.

FIG. 10 is an appearance sketch drawing to show the configuration of a coaxial flexible piezoelectric body polarization apparatus in a first embodiment of the invention. A coaxial flexible piezoelectric body 302 is formed on a core electrode 301 (hereinafter, this molded body will be referred to as piezoelectric body tube 303). Coil-like metal wire, a bundle of fine lines, or the like is used as the core electrode 301. Used as the flexible piezoelectric body 302 is a composite piezoelectric body comprising ceramic piezoelectric body powder of zirconate-lead titanate, etc., added to a polymeric base material of an epoxy resin, a urethane resin, a chloroprene resin, a chlorinated polyethylene resin, etc., a polymeric piezoelectric body of PVDF, etc., or the like.

The piezoelectric body tube 303 is disposed in a groove 361 of a block-like conductor 306 and then is moved by move means (not shown). As the block-like conductor 306, a conductor of iron, stainless steel, copper, brass, aluminum, etc., is used. The grove 361 may be formed like any shape such as a letter U, V, or T if it provides a passage of the piezoelectric body tube 303. To work on the groove 361, cutting, grinding, discharge, extrusion, forging, press working, etc., is executed. In the embodiment, aluminum easily available and easily to work on is used as the material of the block-like conductor 306, and the groove 361 is in the shape of the letter U because of easy working with an end mill. Specifically, the U-shaped groove 361 is 3 mm wide and 6 mm deep relative to the piezoelectric body tube 303 having an outer diameter of 2 mm. As the move means (not shown), the piezoelectric body tube 303 is wound around a winding drum and this winding drum is rotated for moving the piezoelectric body tube 303. In FIG. 10, the move direction of the piezoelectric body tube 303 disposed on the block-like conductor 306 is indicated by the arrow.

The temperature when the coaxial flexible piezoelectric body 302 is polarized generally is higher than that when the coaxial flexible piezoelectric body 302 is used. Thus, to properly hold the temperature of the coaxial flexible piezoelectric body 302 at the polarizing time, heating means is provided. As the heating means, a heating block 371 involving a heater 307 is used to heat the block-like conductor 306 at any desired temperature through an insulation sheet 372. In the embodiment, as the insulation sheet 372, mica 0.5 mm thick is used, but polyimide, poly-tetra-fluoro-ethylene, polyethylene terephthalate (PET), silicone rubber, etc., may be used. The piezoelectric body tube 303 is disposed in the groove 361 of the block-like conductor 306, whereby it is indirectly heated from the surroundings of the piezoelectric body tube 303. Since the piezoelectric body tube 303 can be kept at any desired temperature by controlling output of the heater 307, the coaxial flexible piezoelectric body 302 can be polarized at the necessary temperature.

The block-like conductor 306 is electrically connected by a lead 308b. A lead 308a is connected electrically to the positive pole or the negative pole of DC voltage generation means 309 and the core electrode 301 is connected electrically to the opposite pole of the DC voltage generation means 309 via the lead 308a.

While the piezoelectric body tube 303 is made still or is moved with the parts thus connected, a high voltage is applied between the core electrode 301 and the block-like conductor 306 by the DC voltage generation means 309, so that the coaxial flexible piezoelectric body 302 is polarized. At the polarizing time, a high voltage of 5 to 10 kV/mm is applied between the core electrode 301 and the block-like conductor 306. Specifically, polarization is conducted with the piezoelectric body tube 303 at temperature of 120° C. and with a voltage of 8 kV/mm applied.

When the coaxial flexible piezoelectric body 302 contains a minute defect and the portion containing the defect is disposed on the block-like conductor 306, minute discharge occurring in the defective part causes the block-like conductor 306 and the core electrode 301 to be short-circuited. Consequently, it is made impossible to polarize. However, if the defective part leaves the block-like conductor 306 and the coaxial flexible piezoelectric body 302 disposed on the block-like conductor 306 does not contain any defect at the time, the insulation property between the block-like conductor 306 and the core electrode 301 is restored, so that polarization is made possible. Thus, according to the polarization apparatus of the embodiment, polarization cannot be conducted only when the portion containing the defect is disposed in the groove 361 of the block-like conductor 306; otherwise, polarization is possible. Therefore, an accident in which it is made impossible to polarize the piezoelectric body tube 303 over the whole in the presence of the defective part does not occur.

It is clear that a defect exists in the coaxial flexible piezoelectric body 302 at the point in time when the discharge occurred. Therefore, a defect existing in the piezoelectric body tube 303 of a given length can be detected before an outer electrode 304 is formed, so that the defective part can be easily removed after completion as a piezoelectric cable. Accordingly, manufacturing can be made stable and yield can also be enhanced.

(Embodiment 8)

Figure 11A:
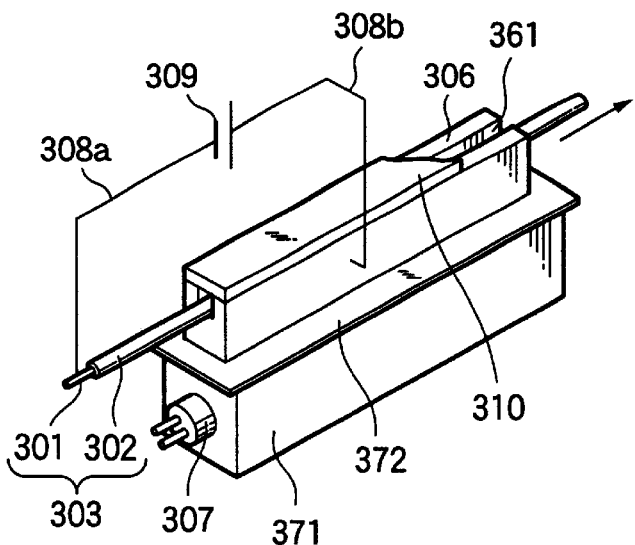
FIG. 11(a) is an appearance sketch drawing to show one configuration of a polarization apparatus in an embodiment 8 of the invention.
Figure 11B:
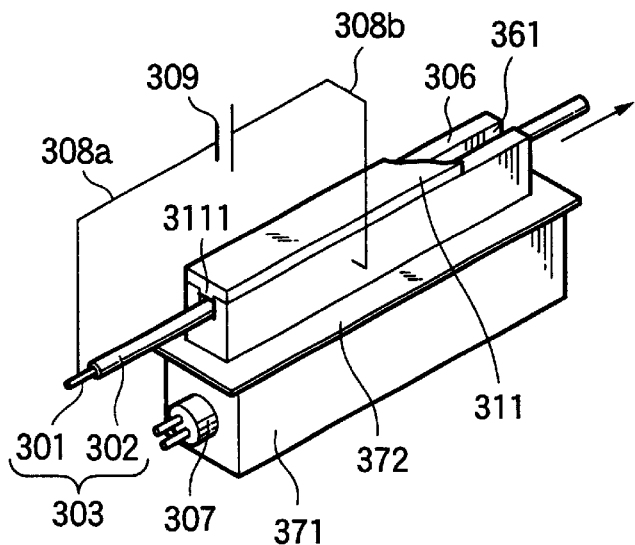
FIG. 11(b) is an appearance sketch drawing to show another configuration of the polarization apparatus in the embodiment 8 of the invention.
Figure 11C:
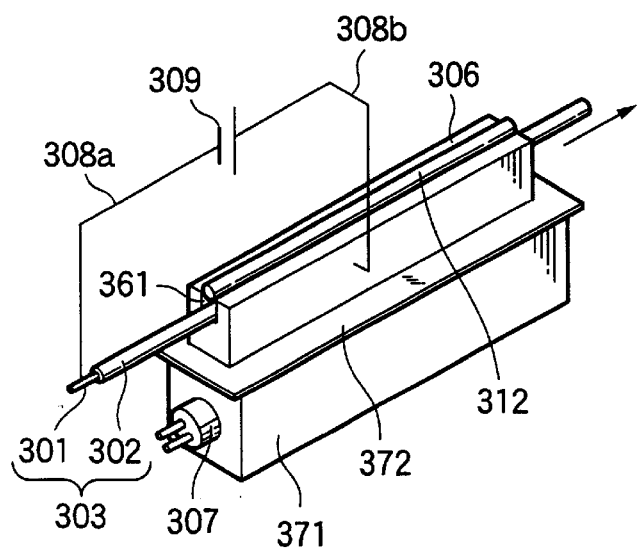
FIG. 11(c) is an appearance sketch drawing to show another configuration of the polarization apparatus in the embodiment 8 of the invention.

FIGS. 11(a), 11(b), and 11(c) are appearance sketch drawings to show the configurations of coaxial flexible piezoelectric body polarization apparatus in an embodiment 8 of the invention. A piezoelectric body tube 303 is disposed in a groove 361 of a block-like conductor 306, whereby it is indirectly heated from the surroundings of the piezoelectric body tube 303. In the embodiment, further a lid 310, 311, or 312 is placed on the top of the groove 361, thereby blocking heat from escaping from the top of the groove 361. Accordingly, the temperature of the piezoelectric body tube 303 can be controlled more properly, so that a coaxial flexible piezoelectric body 302 can be polarized at the necessary temperature. The material of the lid 310, 311, 312 may be of any kind, such as metal, resin, or rubber, if it can resist a predetermined temperature. The lid 310, 311, 312 may be of any shape such as a plate shape, a convex plate shape, or a rod shape, if it can cover the top of the groove 361. The lid 310 in FIG. 11(a) is shaped like a plate and is placed on the top of the groove 361. The lid 310 can be easily worked on and is easily available because a plate-shaped material needs only to be cut to a necessary length. The lid 311 in FIG. 11(b) is a plate having a part shaped like a convexity (3111) and this convex part 3111 of the lid 311 is fitted into the groove 261. The convex part 3111 of the lid 311 is fitted into the groove 361, so that the lid 311 can be easily positioned. The lid 312 in FIG. 11(c) is a round rod having a diameter larger than the width of the groove 361 and is placed on the top of the groove 361. The lid 312 may be of any shape if it is like a bar having a diameter larger than the width of the groove 361. For example, a bar shaped like a polygon such as a triangle, a quadrangle, or a pentagon can be used as the lid 312. The lid 312 can be easily worked on and is easily available because a bar-shaped material needs only to be cut to a necessary length. Since the lid 312 is shaped like a bar having a thickness only covering the groove 361, the amount of the material can also be lessened. In FIGS. 11(a), 11(b), and 11(c), the move direction of the piezoelectric body tube 303 disposed in the block-like conductor 306 is indicated by the arrow.

(Embodiment 9)

Figure 12:
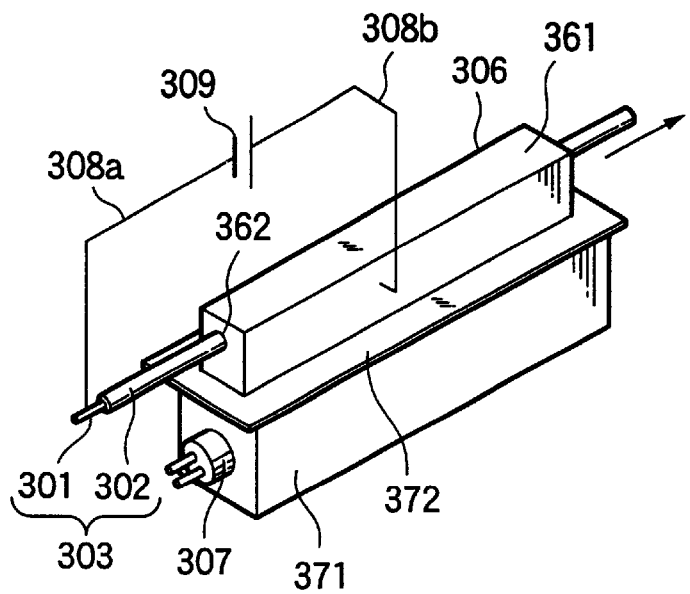
FIG. 12 is an appearance sketch drawing to show the configuration of a polarization apparatus in an embodiment 9 of the invention.

FIG. 12 is an appearance sketch drawing to show the configuration of a coaxial flexible piezoelectric body polarization apparatus in an embodiment 9 of the invention. A piezoelectric body tube 303 is disposed in a hole 362 of a block-like conductor 306, whereby it is indirectly heated from the surroundings of the piezoelectric body tube 303. In the embodiment, the passage of the piezoelectric body tube 303 is the hole 362, so that the piezoelectric body tube 303 is heated uniformly from the wall of the hole 362. Accordingly, the temperature of the piezoelectric body tube 303 can be controlled more properly, so that a coaxial flexible piezoelectric body 302 can be polarized at the necessary temperature. As the block-like conductor 306, a conductor of iron, stainless steel, copper, brass, aluminum, etc., is used. The hole 362 may be of any shape such as a polygonal shape (triangle, quadrangle, pentagon, hexagon, etc.,) or a round shape if it provides the passage of the piezoelectric body tube 303. To make the hole 362, cutting, discharge, extruding, etc., is used. In the embodiment, the block-like conductor 306 uses aluminum and the hole 362 is shaped as a circle so that it can be easily formed by drilling. In FIG. 3, the move direction of the piezoelectric body tube 303 disposed in the block-like conductor 306 is indicated by the arrow.

(Embodiment 10)

Figure 13:
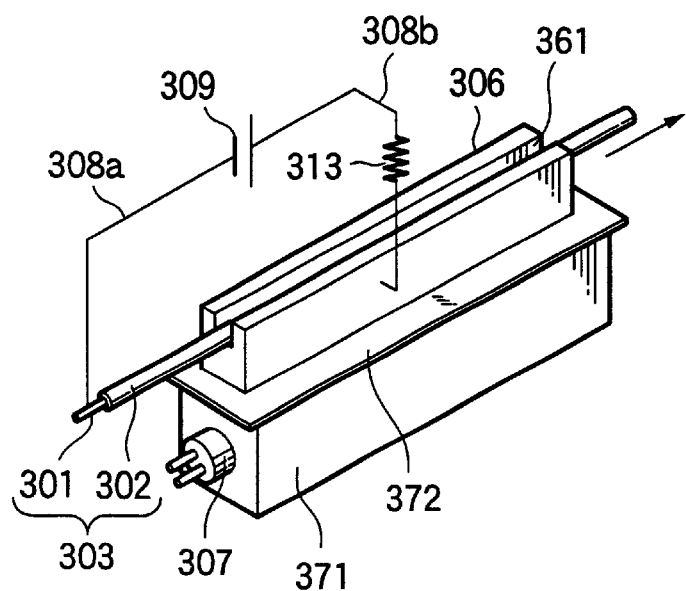
FIG. 13 is an appearance sketch drawing to show the configuration of a polarization apparatus in an embodiment 10 of the invention.

FIG. 13 is an appearance sketch drawing to show the configuration of a coaxial flexible piezoelectric body polarization apparatus in an embodiment 10 of the invention. The coaxial flexible piezoelectric body polarization apparatus in the embodiment 9 comprises a resistor 313 in series with a piezoelectric body tube 303 in addition to the configuration of the coaxial flexible piezoelectric body polarization apparatus in the embodiments 7, 8, and 9. When a coaxial flexible piezoelectric body 302 of the portion containing a minute defect becomes a coaxial flexible piezoelectric body polarized 302, the voltage applied to the coaxial flexible piezoelectric body 302 lowers and it is made impossible to polarize. However, since current can be controlled by the resistor 313, damage to DC voltage generation means is prevented and the coaxial flexible piezoelectric body polarized 302 after the defective part of the coaxial flexible piezoelectric body 302 leaves a block-like conductor 306 can be again normally polarized. Therefore, if a defective part exists, an accident in which it is made impossible to polarize the whole coaxial flexible piezoelectric body 302 does not occur. This indicates that a minute defect exists in the portion of the coaxial flexible piezoelectric body polarized 302 of a given length, so that a minute defect existing within the given length range can be detected before an outer electrode 304 is formed.

(Embodiment 11)

Figure 14:
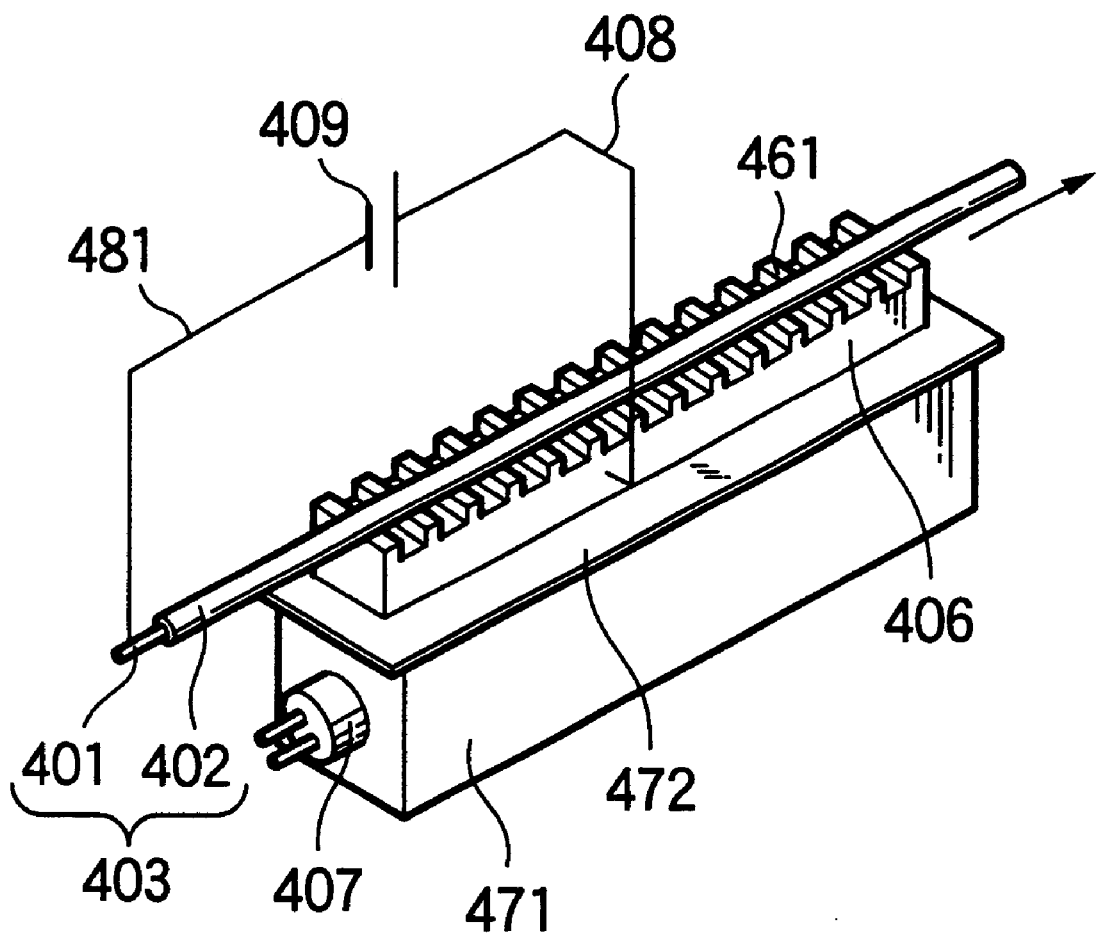
FIG. 14 is an appearance sketch drawing to show the configuration of a polarization apparatus in an embodiment 11 of the invention.

FIG. 14 is an appearance sketch drawing to show the configuration of a coaxial flexible piezoelectric body polarization apparatus in an embodiment 11 of the invention. A coaxial flexible piezoelectric body 402 is formed on a core electrode 401. This molded body will be hereinafter referred to as piezoelectric body tube 403. Coil-like metal wire, a bundle of fine lines, or the like is used as the core electrode 401. Used as the flexible piezoelectric body 402 is a composite piezoelectric body comprising ceramic piezoelectric body powder of zirconate-lead titanate, etc., added to a polymeric base material of an epoxy resin, a urethane resin, a chloroprene resin, a chlorinated polyethylene resin, etc., a polymeric piezoelectric body of PVDF, etc., or the like.

The piezoelectric body tube 403 is disposed in a piezoelectric body tube passage section 461 placed in a block-like conductor 406 and is moved by move means (not shown). The piezoelectric body tube passage section 461 is made uneven like pits and projections. As the block-like conductor 406, a conductor of iron, stainless steel, copper, brass, aluminum, graphite, etc., is used. To make the piezoelectric body tube passage section 461 uneven like pits and projections, cutting, discharge, forging, etc., is executed. In the embodiment, aluminum easily available and easily to work on is used as the material of the block-like conductor 406. Specifically, it is 30 mm wide, 20 mm high, and 500 mm long relative to the piezoelectric body tube 403 having an outer diameter of 2 mm. As the pits and projections of the piezoelectric body tube passage section 461, each pit is 0.5 mm deep and 1.5 mm wide and each projection is 1 mm wide. This means that the pits and the projections are formed continuously at 2.5-mm pitches. Since the pits and projections of the piezoelectric body tube passage section 461 are intended for decreasing the contact area with the piezoelectric body tube 403, knurls such as spline or hatching may be adopted. As the move means (not shown), the piezoelectric body tube 403 is wound around a winding drum and this winding drum is rotated for moving the piezoelectric body tube 403. In FIG. 1, the move direction of the piezoelectric body tube 403 disposed on the block-like conductor 406 is indicated by the arrow.

The temperature when the coaxial flexible piezoelectric body 402 is polarized generally needs to be set higher than that when the coaxial flexible piezoelectric body 402 is used; the coaxial flexible piezoelectric body 402 is polarized while it is held at the necessary temperature. Since the coaxial flexible piezoelectric body 402 is in contact with the pits and projections of the piezoelectric body tube passage section 461, the block-like conductor 406 can be heated for heating the coaxial flexible piezoelectric body 402 to the necessary temperature. To heat the coaxial flexible piezoelectric body 402 to the necessary temperature, a heating block 471 involving a heater 407 is used to heat the block-like conductor 406 at any desired temperature through an insulation sheet 472. In the embodiment, as the insulation sheet 472, mica 0.5 mm thick is used, but an electric insulation material such as polyimide, poly-tetra-fluoro-ethylene, polyethylene terephthalate (PET), or silicone rubber may be used.

The block-like conductor 406 and a lead 408 are electrically connected and the lead 408 is electrically connected to the positive pole or the negative pole of DC voltage generation means 409. The core electrode 401 and a lead 481 are electrically connected and the lead 481 is connected to the opposite pole of the DC voltage generation means 409. While the piezoelectric body tube 403 is made still or is moved with the parts thus connected, a high voltage is applied between the core electrode 401 and the block-like conductor 406 by the DC voltage generation means 409 for polarizing the coaxial flexible piezoelectric body 402. At the polarizing time, a high voltage of 5 to 10 kV/mm is applied between the core electrode 401 and the block-like conductor 406. Specifically, polarization is conducted with the piezoelectric body tube 403 at temperature of 120° C. and with a voltage of 8 kV/mm applied.

The piezoelectric body tube passage section 461 is made uneven like pits and projections to lessen frictional resistance. The piezoelectric body tube 403 comes in contact only with the projections of the pits and projections. The force of causing the coaxial flexible piezoelectric body 402 and the piezoelectric body tube passage section 461 to attract each other, generated by an electrostatic force is proportional to the area of the projections. The frictional force when the piezoelectric body tube 403 is moved is proportional to the force of causing the coaxial flexible piezoelectric body 402 and the piezoelectric body tube passage section 461 to attract each other. This means that the frictional force between the piezoelectric body tube 403 and the piezoelectric body tube passage section 461 can be decreased in the presence of the pits and projections and the piezoelectric body tube 403 can be moved by a small force.

(Embodiment 12)

Figure 15:
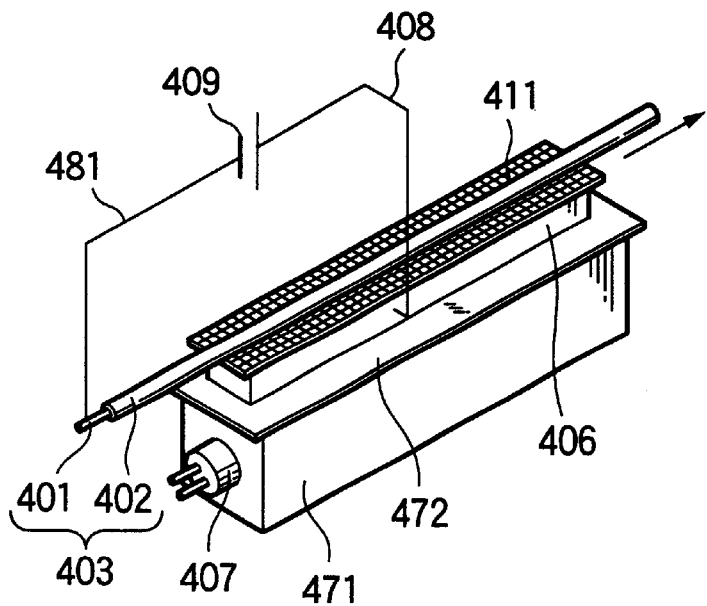
FIG. 15 is an appearance sketch drawing to show the configuration of a polarization apparatus in an embodiment 12 of the invention.

FIG. 15 is an appearance sketch drawing to show the configuration of a coaxial flexible piezoelectric body polarization apparatus in an embodiment 8 of the invention. In the embodiment 8, a piezoelectric body tube passage section is formed of wire netting 410. A piezoelectric body tube 403 is disposed on the wire netting 410 placed on a face of a block-like conductor 406 and is moved by move means (not shown). The wire netting 410 has a surface made uneven like pits and projections. The metal netting 410 is used to form pits and projections, so that the frictional force between the piezoelectric body tube 403 and the piezoelectric body tube passage section (in the embodiment 2, the wire netting 410) can be decreased and the piezoelectric body tube 403 can be moved by a small force without forming the disposition surface of the piezoelectric body tube 403 like pits and projections.

As the wire netting 410, a conductor of iron, stainless steel, copper, brass, aluminum, etc., is used. In the embodiment, stainless steel easily available and resisting corrosion is used as the material of the wire netting 410. Specifically, a stainless steel net having a line diameter of 0.2 mm and mesh 450 is used.

(Embodiment 13)

Figure 16:
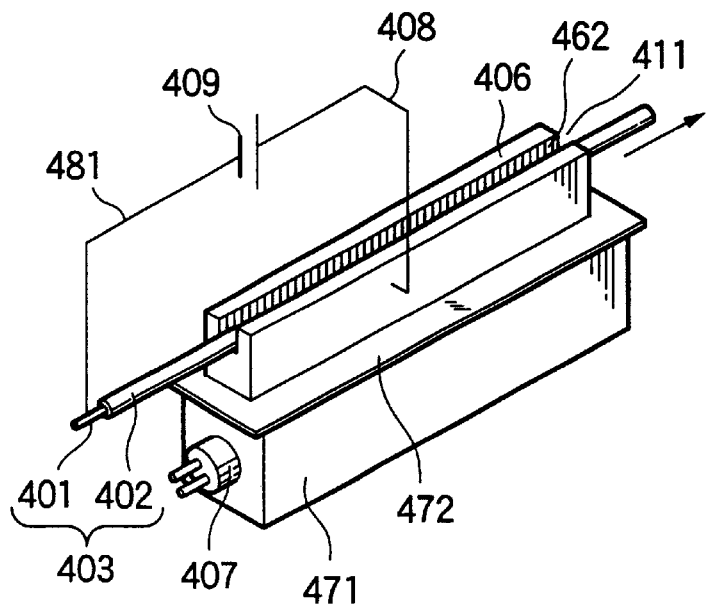
FIG. 16 is an appearance sketch drawing to show the configuration of a polarization apparatus in an embodiment 13 of the invention.
Figure 17:
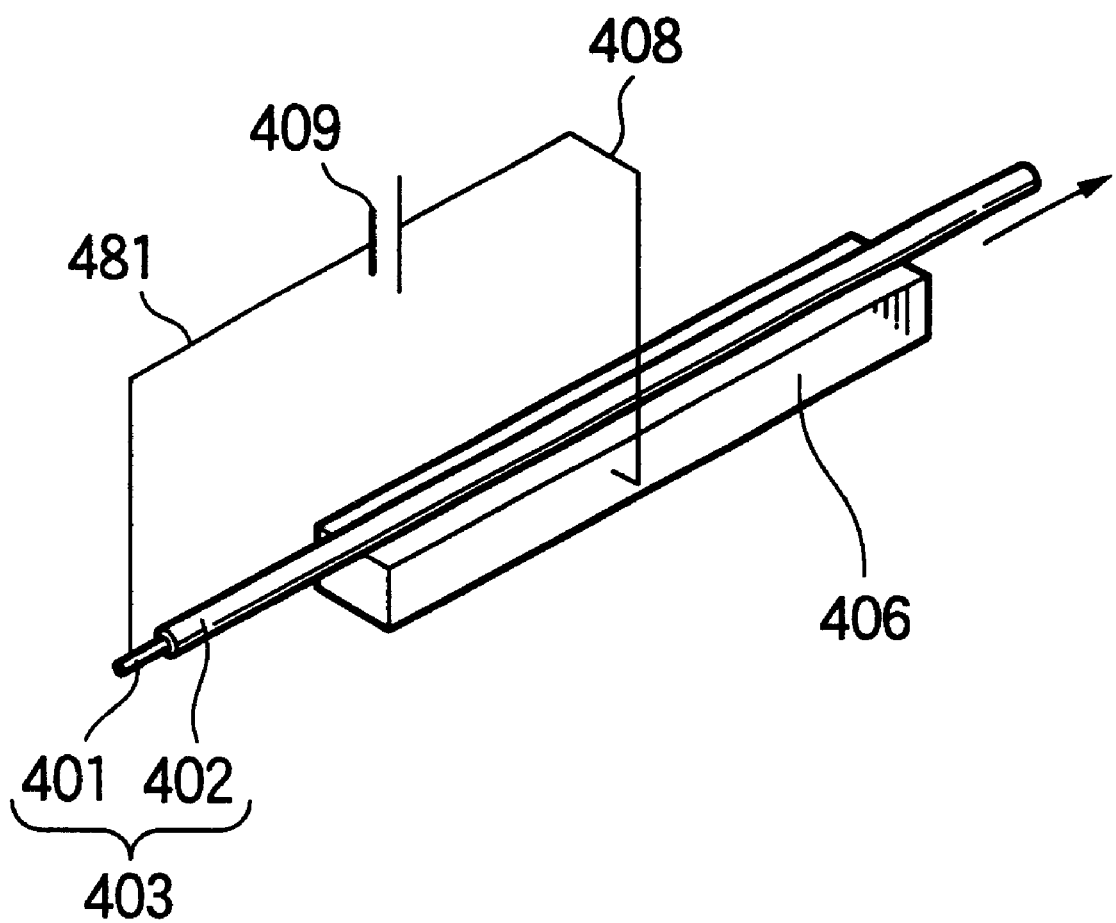
FIG. 17 is an appearance sketch drawing to show the configuration of a polarization apparatus in a coaxial flexible piezoelectric body cable in a related art.

FIG. 16 is an appearance sketch drawing to show the configuration of a coaxial flexible piezoelectric body polarization apparatus in an embodiment 9 of the invention. The coaxial flexible piezoelectric body polarization apparatus is a polarization apparatus wherein a block-like conductor 406 is formed with a groove 411 and the groove 411 is used as a passage section of a piezoelectric body tube 403 and has an inner face formed as a pit-and-projection (uneven) shape 462. When the block-like conductor 406 is heated for heating the piezoelectric body tube 403 disposed in the groove 411 of the block-like conductor 406, the piezoelectric body tube 403 is heated from the bottom and both walls of the groove 411. Thus, the piezoelectric body tube 403 is heated more evenly, so that the coaxial flexible piezoelectric body 402 can be polarized at the necessary temperature. The top is opened and the piezoelectric body tube 403 can be easily disposed from above the groove 411. Since the groove 411 of the passage section of the piezoelectric body tube 403 has the inner face formed as the pit-and-projection (uneven) shape 462, the piezoelectric body tube 403 comes in contact only with the projections of the pits and projections and thus can be moved by a small force.

As the block-like conductor 406, a conductor of iron, stainless steel, copper, brass, aluminum, graphite, etc., is used. The groove 411 may be of any shape such as a polygonal shape (triangle, quadrangle, pentagon, hexagon, etc.,) or the shape of the letter U if it allows the piezoelectric body tube 403 to be disposed. To make the groove 411, cutting, discharge, extruding, etc., is used. The pit-and-projection (uneven) shape 462 may be formed by executing cutting, discharge, press working, etc., directly on the inner face of the groove 411 or may be provided by disposing a conductive member formed with pits and projections (wire netting, a punching sheet, a press sheet formed with pits and projections, or the like) on the groove 411.

In the embodiment, the block-like conductor 406 uses aluminum, the groove 411 is in the shape of the letter U because of easy working with an end mill, and a stainless steel net is disposed on the U-shaped inner face to provide the pit-and-projection (uneven) shape 462. In FIG. 16, the move direction of the piezoelectric body tube 403 disposed in the block-like conductor 406 is indicated by the arrow.

[Advantages of the Invention]

As described above, according to the invention as in aspects 1 to 4, if a minute defect is contained in the portion wound around the first conductor drum and the second conductor drum in an intimate contact condition, the flexible piezoelectric body polarized of a given length containing the defect cannot be polarized, but the remaining piezoelectric body tube can be polarized. The defect existing in the flexible piezoelectric body polarized of the given length can also be detected before the outer electrode is formed.

According to the invention as in aspect 5, polarization can be conducted while the thickness of the flexible piezoelectric body is monitored.

According to the invention as in aspects 6 to 8, polarization can be conducted at a proper temperature while safety of polarization work is ensured.

According to the invention as in aspect 9, if discharge occurs in a minute defective part at the polarizing time, damage to the first conductor drum and the second conductor drum caused by the discharge can be decreased.

According to the invention as in aspects 10 and 11, polarization can be conducted with safety while the piezoelectric body tube is being wound.

The invention as in aspect 12 makes it possible to easily bring the flexible piezoelectric body into contact with the grooves of the first conductor drum and the grooves of the second conductor drum.

As described above, according to the invention as in aspects 13 to 15, if a minute defect is contained in the portion of the flexible piezoelectric body disposed on the block-like conductor, the flexible piezoelectric body polarized of a given length containing the defect cannot be polarized, but the remaining piezoelectric body tube can be polarized. The defect existing in the flexible piezoelectric body polarized of the given length can also be detected before the outer electrode is formed.

According to the invention as in aspect 17, the piezoelectric body tube can be polarized consecutively.

As described above, according to the invention as in aspects 13, 14, and 20 to 22, if a minute defect is contained in the portion of the flexible piezoelectric body disposed on the block-like conductor, the flexible piezoelectric body polarized of a given length containing the defect cannot be polarized, but the remaining piezoelectric body tube can be polarized. The defect existing in the flexible piezoelectric body polarized of the given length can also be detected before the outer electrode is formed.

According to the invention as in aspect 24, the piezoelectric body tube can be polarized consecutively.

As described above, according to the invention as in aspects 27 to 31, the block-like conductor has the piezoelectric body tube passage section formed with pits and projections to lessen frictional resistance, so that the frictional force between the piezoelectric body tube and the piezoelectric body tube passage section can be decreased in the presence of the pits and projections and the piezoelectric body tube can be moved by a small force.

According to the invention as in aspects 32 and 33, the frictional force between the piezoelectric body tube and the piezoelectric body tube passage section can be decreased and the piezoelectric body tube can be moved by a small force. Thus, when the piezoelectric body tube is pulled and moved, it is not stretched or broken and high-reliability polarization method can be provided.

What is claimed is:

1. A polarization apparatus of a coaxial flexible piezoelectric cable, comprising:

a first conductor drum having a plurality of grooves for coming in contact with a roughly half peripheral surface of a piezoelectric body tube including a coaxial flexible piezoelectric body formed surrounding a core electrode and being rotated in a given direction, a second conductor drum being placed behind said first conductor drum and having a plurality of grooves for coming in contact with another roughly half peripheral surface of said piezoelectric body tube, winding means being placed behind said second conductor drum for winding said piezoelectric body tube, conduction means for electrically connecting said first conductor drum and said second conductor drum, and voltage generation means being connected to said conduction means and said core electrode.

2. The polarization apparatus of a coaxial flexible piezoelectric cable as claimed in claim 1, wherein said first conductor drum and said second conductor drum are rotated by said piezoelectric body tube wound by said winding means.

3. The polarization apparatus of a coaxial flexible piezoelectric cable as claimed in claim 1, further comprising:

tension application means for applying a tension to said piezoelectric body tube before said piezoelectric body tube is disposed on said first conductor drum.

4. The polarization apparatus of a coaxial flexible piezoelectric cable as claimed in claim 1, further comprising:

discharging means for removing surface charges of said piezoelectric body tube after said piezoelectric body tube leaves said second conductor drum.

5. The polarization apparatus of a coaxial flexible piezoelectric cable as claimed in claim 1, further comprising:

capacitance detection means for detecting capacitance between said core electrode of said piezoelectric body tube and said conduction means.

6. The polarization apparatus of a coaxial flexible piezoelectric cable as claimed in claim 1, further comprising:

an electrical insulating partition wall surrounding said first conductor drum and said second conductor drum.

7. The polarization apparatus of a coaxial flexible piezoelectric cable as claimed in claim 6, wherein said electrical insulating partition wall is transparent.

8. The polarization apparatus of a coaxial flexible piezoelectric cable as claimed in claim 6, further comprising:

warm air generation means for blowing a warm current of air into said electrical insulating partition wall.

9. The polarization apparatus of a coaxial flexible piezoelectric cable as claimed in claim 1, wherein said first conductor drum and said second conductor drum are formed of stainless steel.

10. A polarization method of a coaxial flexible piezoelectric cable, comprising the steps of:

disposing the piezoelectric body tube in one groove of a first conductor drum, disposing said piezoelectric body tube in a groove of a second conductor drum, repeating to dispose said piezoelectric body tube in another groove of said first conductor drum in such a manner that said piezoelectric body tube of a predetermined length is disposed, and applying a DC voltage between said core wire of said piezoelectric body tube and said conduction means, when said piezoelectric body tube is wound by winding means.

11. The polarization method of a coaxial flexible piezoelectric cable as claimed in claim 10, wherein said core wire of said piezoelectric body tube is placed at ground potential and a DC voltage is applied between said core wire and said conduction means.

12. The polarization method of a coaxial flexible piezoelectric cable as claimed in claim 11, wherein said coaxial flexible piezoelectric body comprises a rubber-based resin and ceramic piezoelectric body powder.

13. A polarization apparatus of a coaxial flexible piezoelectric cable, comprising:

a block-like conductor having a passage of a piezoelectric body tube including a coaxial flexible piezoelectric body formed surrounding a core electrode, move means being placed behind said block-like conductor for moving the piezoelectric body tube, and DC voltage generation means being connected to said block-like conductor and said core electrode.

14. The polarization apparatus of a coaxial flexible piezoelectric cable as claimed in claim 13, further comprising:

heating means for heating said block-like conductor.

15. The polarization apparatus of a coaxial flexible piezoelectric cable as claimed in claim 13, wherein said passage of said piezoelectric body tube, placed in said block-like conductor is on a face of said block-like conductor.

16. The polarization apparatus of a coaxial flexible piezoelectric cable as claimed in claim 13, further comprising:

a resistor in series with said piezoelectric body tube.

17. A polarization method of a coaxial flexible piezoelectric cable, comprising the steps of:

disposing a piezoelectric body tube in a passage made in a block-like conductor, and applying a DC voltage between core wire of said piezoelectric body tube and said block-like conductor, when said piezoelectric body tube is still or is moved by move means.

18. The polarization method of a coaxial flexible piezoelectric cable as claimed in claim 17, further comprising:

heating means for heating said block-like conductor.

19. The polarization method of a coaxial flexible piezoelectric cable as claimed in claim 17, wherein said core wire of said piezoelectric body tube is placed at ground potential and a DC voltage is applied between said core wire and said block-like conductor.

20. The polarization apparatus of a coaxial flexible piezoelectric cable as claimed in claim 13, wherein said piezoelectric body tube passage placed in said block-like conductor is a groove.

21. The polarization apparatus of a coaxial flexible piezoelectric cable as claimed in claim 20, wherein a cover is placed on the groove of said piezoelectric body tube passage placed in said block-like conductor.

22. The polarization apparatus of a coaxial flexible piezoelectric cable as claimed in claim 13, wherein said piezoelectric body tube passage placed in said block-like conductor is a hole.

23. The polarization apparatus of a coaxial flexible piezoelectric cable as claimed in claim 13, further comprising:

a resistor in series with said piezoelectric body tube.

24. A polarization method of a coaxial flexible piezoelectric cable comprising the steps of:

disposing a piezoelectric body tube in a passage made in a block-like conductor, and applying a DC voltage between core wire of said piezoelectric body tube and said block-like conductor, when said piezoelectric body tube is still or is moved by move means.

25. The polarization method of a coaxial flexible piezoelectric cable as claimed in claim 24, further comprising:

heating means for heating said block-like conductor.

26. The polarization method of a coaxial flexible piezoelectric cable as claimed in claim 24, wherein said core wire of said piezoelectric body tube is placed at ground potential, and a DC voltage is applied between said core wire and said block-like conductor.

27. A polarization apparatus of a coaxial flexible piezoelectric body cable, comprising:

a block-like conductor having a passage section of a piezoelectric body tube including a coaxial flexible piezoelectric body formed surrounding a core electrode, said passage section being made uneven like pits and projections, and DC voltage generation means being connected to said block-like conductor and said core electrode.

28. The polarization apparatus of a coaxial flexible piezoelectric body cable as claimed in claim 27, wherein said block-like conductor is provided with a heater.

29. The polarization apparatus of a coaxial flexible piezoelectric cable as claimed in claim 27, wherein wire netting is disposed on said block-like conductor to provide the passage section of said piezoelectric body tube.

30. The polarization apparatus of a coaxial flexible piezoelectric cable as claimed in claim 27, wherein said block-like conductor is formed with a groove formed with pits and projections to provide the passage section of said piezoelectric body tube.

31. The polarization apparatus of a coaxial flexible piezoelectric cable as claimed in claim 27, wherein said block-like conductor is formed with a groove on which wire netting is disposed to provide the passage section of said piezoelectric body tube.

32. A polarization method of a coaxial flexible piezoelectric body cable comprising the steps of:

disposing a piezoelectric body tube in a passage section of a block-like conductor having the passage section of said piezoelectric body tube including a coaxial flexible piezoelectric body formed surrounding a core electrode, the passage section being made uneven like pits and projections, and applying a DC voltage between said block-like conductor and said core electrode.

33. The polarization method of a coaxial flexible piezoelectric body cable as claimed in claim 32, wherein said block-like conductor is provided with a heater for heating said block-like conductor.

* * * * *